United States Patent
Ikenaga et al.

(10) Patent No.: US 8,390,313 B2
(45) Date of Patent: Mar. 5, 2013

(54) SEMICONDUCTOR INTEGRATED CIRCUIT DEVICE

(75) Inventors: Yoshifumi Ikenaga, Kanagawa (JP); Masahiro Nomura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 7 days.

(21) Appl. No.: 13/052,400

(22) Filed: Mar. 21, 2011

(65) Prior Publication Data

US 2011/0241725 A1    Oct. 6, 2011

(30) Foreign Application Priority Data

Mar. 31, 2010    (JP) .................................. 2010-082458

(51) Int. Cl.
*H03K 19/00* (2006.01)
*G01R 25/00* (2006.01)
(52) U.S. Cl. ...................................... 326/16; 324/76.77
(58) Field of Classification Search ................. None
See application file for complete search history.

(56) References Cited

U.S. PATENT DOCUMENTS

| 6,924,679 | B2 * | 8/2005 | Seno et al. ..................... 327/158 |
| 7,221,131 | B2 * | 5/2007 | Ozawa et al. ................. 323/272 |
| 7,332,973 | B2 * | 2/2008 | Lee et al. ........................ 331/25 |
| 2008/0297233 | A1 | 12/2008 | Tokunaga |
| 2011/0074398 | A1 * | 3/2011 | Barton et al. ................. 324/133 |

FOREIGN PATENT DOCUMENTS

JP    2009-10344 A    1/2009

* cited by examiner

*Primary Examiner* — Crystal L Hammond
(74) *Attorney, Agent, or Firm* — Foley & Lardner LLP

(57) ABSTRACT

When an operation of a specified one of monitor circuits is defective or any of elements forming a ring oscillator in each of the monitor circuits has characteristic abnormality, if voltage control is performed based on a result from the monitor operating at a lowest speed, a required voltage may be over-estimated. This results in an increase in power consumption, and also causes an accuracy reduction when the average value of detection results from the multiple monitors is calculated. The multiple monitor circuits are provided. Of the detection results therefrom, any detection result falling outside a pre-determined range is ignored, and the average value of the remaining monitor results is used as a final monitor detection value.

10 Claims, 27 Drawing Sheets

SEMICONDUCTOR INTEGRATED CIRCUIT DEVICE

CROSS-REFERENCE TO RELATED APPLICATIONS

The disclosure of Japanese Patent Application No. 2010-82458 filed on Mar. 31, 2010 including the specification, drawings and abstract is incorporated herein by reference in its entirety.

BACKGROUND

The present invention relates to a semiconductor integrated circuit device, and particularly to a semiconductor integrated circuit device having a monitor circuit for detecting a characteristic of an internal circuit.

In a semiconductor integrated circuit using a CMOS logic gate, as a method for reducing electric power, DVFS (Dynamic Voltage and Frequency Scaling) for controlling a power source voltage depending on a required speed is effective.

Representatives of a method for controlling a power source voltage include a method based on a delay monitor. Since there are characteristic variations in a chip, performance obtained by subtracting a certain degree of margin from chip performance detected with the delay monitor is lowest performance in a real chip. The voltage needs to be controlled such that the lowest performance satisfies the required speed. Here, when the accuracy of the chip performance detected by the delay monitor is low, it is necessary to overestimate the margin, and consequently the power source voltage is controlled to be high, resulting in increased power consumption. Accordingly, by, e.g., disposing multiple monitors in the chip, and retrieving a result from the monitor operating at a lowest speed, the margin to be estimated can be reduced.

FIG. 1 is a block diagram schematically showing a configuration of a semiconductor integrated circuit device according to a prior art technology. The semiconductor integrated circuit device of FIG. 1 includes a power supply circuit and a chip. Here, the chip includes multiple monitor circuits, a detection circuit, and a control circuit. The multiple monitor circuits detect a characteristic of the chip at mutually different positions, and output the results of detection toward the detection circuit. The detection circuit outputs an overall result obtained by combining the multiple detection results transmitted from the multiple monitor circuits toward the control circuit. The control circuit generates a control signal in accordance with the overall result. The power supply circuit adjusts a power source voltage $V_{DD}$ in accordance with the control signal, and supplies the adjusted power source voltage $V_{DD}$ to the chip.

In the semiconductor integrated circuit device of FIG. 1, when the characteristic variations in the chip are of a known magnitude, the average value of the detection results from the multiple monitors is calculated, and the variations are subtracted therefrom to allow the lowest performance in the chip to be estimated.

With regard to the foregoing, Japanese Unexamined Patent Publication No. 2009-10344 discloses a description related to a semiconductor integrated circuit. The semiconductor integrated circuit includes a power source voltage supply means for supplying a power source voltage to one or more internal circuits. The semiconductor integrated circuit has the following characteristic feature. That is, the circuit includes multiple process monitor means disposed at multiple locations over the circuit to operate in accordance with the power source voltage, and detect monitor data on the individual locations. The power source voltage supply means generates power source voltages in accordance with the multiple monitor data items mentioned above, and supplies the power source voltages to the internal circuits.

SUMMARY

When an operation of a specified one of the monitor circuits is defective, or any of elements forming a ring oscillator in the monitor circuit has characteristic abnormality, if voltage control is performed based on the result from the monitor operating at the lowest speed, a required voltage may be overestimated. This results in an increase in power consumption, and also reduces accuracy when the average value of the detection results from the multiple monitors is calculated.

Hereinbelow, a means for addressing the problem will be described using reference numerals used in DESCRIPTION OF THE PREFERRED EMBODIMENTS. The reference numerals are added to define the correspondence relationship between the description in WHAT IS CLAIMED and DESCRIPTION OF THE PREFERRED EMBODIMENTS. However, the numerals should not be used for the interpretation of the technical scope of the invention described in WHAT IS CLAIMED.

A semiconductor integrated circuit device (1) according to the present invention includes multiple delay elements (**204, 20(*i*)), a group of monitor circuits (2(*i*), 2), a control circuit (3), and a summing circuit (4). Here, the multiple delay elements (204, 20(*i*)) are individually disposed at multiple locations in the same semiconductor chip, and have respective characteristics in accordance with the multiple locations. The group of monitor circuits (2, 2(*i*)) measures the characteristics of the multiple delay elements (204, 20(*i*)). The control circuit (3) controls the group of monitor circuits (2(*i*), 2). The summing circuit (4) sums the results of the measurement, and calculates an overall characteristic of the semiconductor chip. The control circuit (3) excludes, from a target of summation, any of the multiple delay elements (204, 20(*i*)**) which show the result of the measurement falling outside a predetermined range.

The semiconductor integrated circuit device of the present invention allows high monitor detection accuracy to be obtained. This is because the multiple monitor circuits are provided and, of the detection results therefrom, those falling outside the predetermined range are ignored, while the average value of the remaining monitor results is used as a final monitor detection value. That is, even when there is a defect in any of the monitor circuits, the influence thereof can be removed.

DETAILED DESCRIPTION OF THE PREFERRED EMBODIMENTS

Referring to the accompanying drawings, embodiments for implementing a semiconductor integrated circuit device according to the present invention will be described hereinbelow.

First Embodiment

Figure 1:
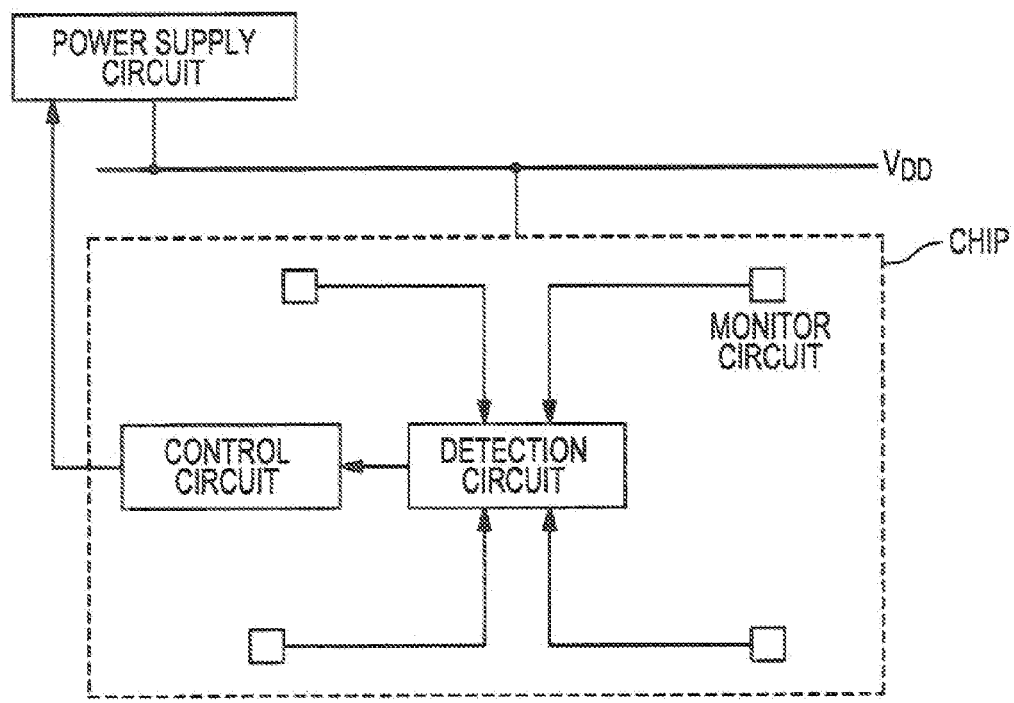
FIG. 1 is a block diagram schematically showing a configuration of a semiconductor integrated circuit device according to a related art technology.
Figure 2:
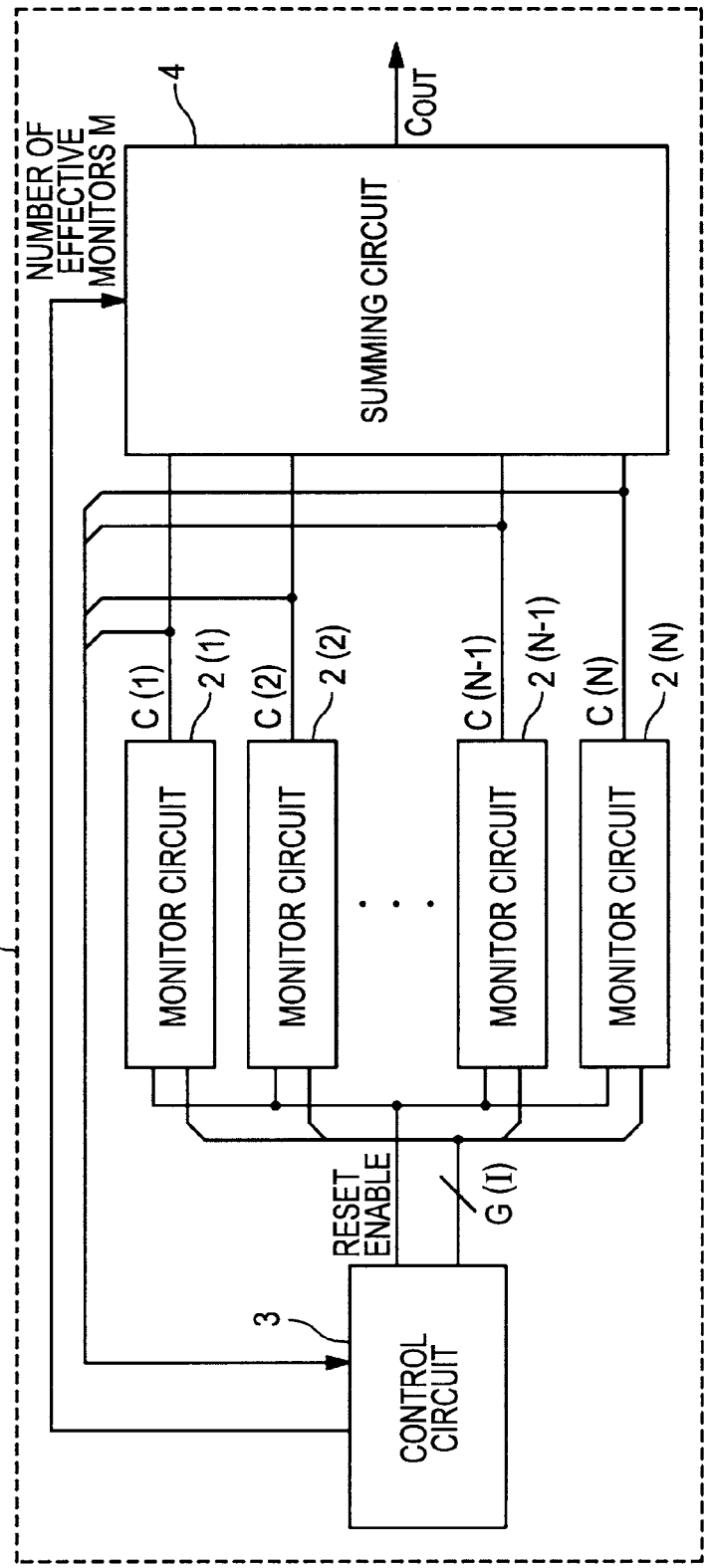
FIG. 2 is a block diagram showing a configuration of a semiconductor integrated circuit device according to a first embodiment of the present invention.

FIG. 2 is a block diagram showing a configuration of a semiconductor integrated circuit device 1 according to a first embodiment of the present invention. A description will be given of the components of the semiconductor integrated circuit device 1 of FIG. 2. The semiconductor integrated circuit device 1 of FIG. 2 includes the total of N monitor circuits 2(1), 2(2), . . . , and 2(N), a control circuit 3, and a summing circuit 4. Here, N represents any integer of 2 or more. Note that each of the monitor circuits 2(1) to 2(N) has the same configuration, and therefore any integer included in the range of 1 to N will be hereinafter represented by "i", and expressed in a generalized form such as "2(i)" in the description given below.

Each of the N monitor circuits 2(i) includes a RESET signal input portion, an ENABLE signal input portion, a G(i) signal input portion, and a C(i) signal output portion. The control circuit 3 includes a C(i) signal input portion, a RESET signal output portion, an ENABLE signal output portion, N G(i) signal output portions, and an M signal output portion. The summing circuit 4 includes a C(i) signal input portion, an M signal input portion, and a $C_{out}$ signal output portion. The respective functions of a RESET signal, an ENABLE signal, a G(i) signal, a C(i) signal, an M signal, and a $C_{out}$ signal will be described later.

A description will be given of coupling relations between the components of the semiconductor integrated circuit device 1 of FIG. 2. In each of the N monitor circuits 2(i), the RESET signal input portion, the ENABLE signal input portion, and the G(i) signal input portion are respectively coupled to the RESET signal output portion, the ENABLE signal output portion, and the corresponding G(i) signal output portion of the control circuit 3, while the C(i) output portion is coupled to the C(i) signal input portion of the control circuit 3 and to the C(i) signal input portion of the summing circuit 4. The M signal output portion of the control circuit 3 is coupled to the M signal input portion of the summing circuit 4.

A description will be given of an operation of the semiconductor integrated circuit device 1 of FIG. 2. Each of the monitor circuits 2(i) evaluates the performance of the semiconductor integrated circuit device 1 independently of each other. The summing circuit 4 collects evaluations from the monitor circuits 2(i) to accurately evaluate the performance of the semiconductor integrated circuit device 1. The control circuit 3 controls the monitor circuits 2(i) and the summing circuit 4.

Figure 3:
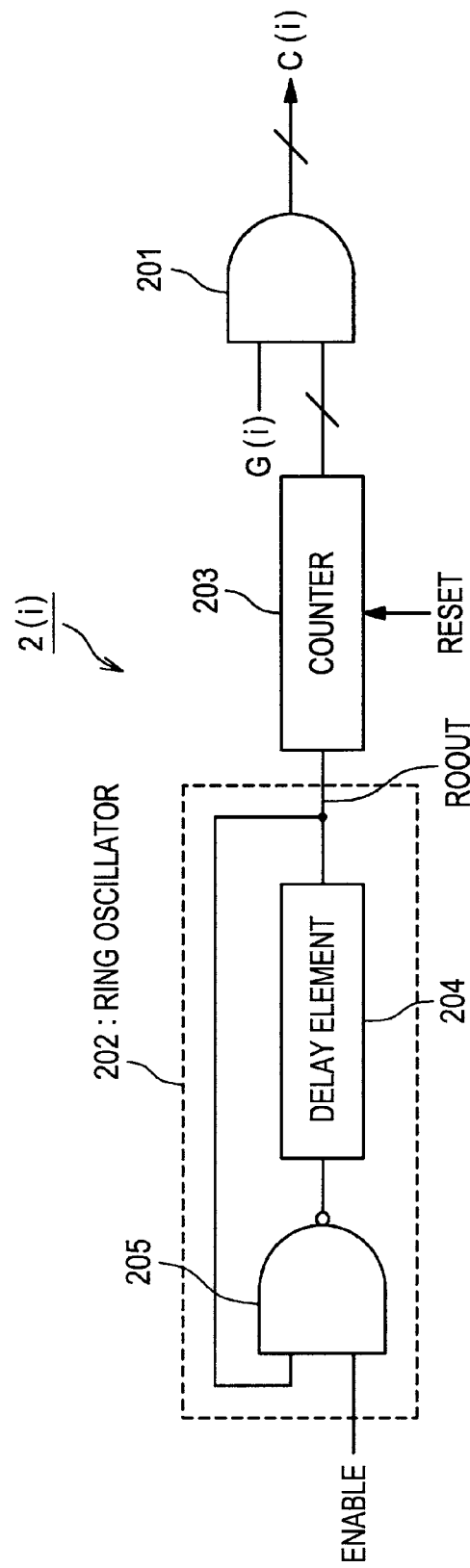
FIG. 3 is a block diagram showing a configuration of a monitor circuit according to the first embodiment of the present invention.

FIG. 3 is a block diagram showing a configuration of each of the monitor circuits 2(i) according to the first embodiment of the present invention. A description will be given of the components of the monitor circuit 2(i) of FIG. 3. Each of the monitor circuits 2(i) includes a ring oscillator 202, a counter 203, and an AND gate 201. Here, the ring oscillator 202 includes a NAND gate 205 and a delay element 204. Note that, in FIG. 3, only one delay element 204 is shown but, in an actual situation, multiple the delay elements 204 coupled in series may also be used. This is for sufficiently reducing the influence given by random variations in a characteristic that each of the delay elements 204 can have to a delay time.

Here, as the delay element 204, there may be used, e.g., a buffer circuit, an even number of NOT gates coupled in series, or the like. As the delay element 204, an odd number of NOT gates coupled in series may also be used but, in this case, the NAND gate 205 needs to be replaced with an AND gate.

The NAND gate 205 includes a first input portion, the ENABLE signal input portion, and an output portion. The delay element 204 includes an input portion and an output portion. The counter 203 includes a first input portion and the RESET signal input portion. The AND gate 201 includes a first input portion, the G(i) signal input portion, and the C(i) signal output portion.

The RESET signal input portion, the ENABLE signal input portion, and the G(i) signal input portion of the monitor circuit 2(i) are respectively coupled to the RESET signal input portion of the counter 203, the ENABLE signal input portion of the NAND gate 205, and the G(i) signal input portion of the AND gate 201. The output portion of the NAND gate 205 is coupled to the input portion of the delay element 204. The output portion of the delay element 204 is coupled to the first input portion of the counter 203 and to the first input portion of the NAND gate 205. The output portion of the counter 203 is coupled to the first input portion of the AND gate 201. The C(i) signal output portion of the AND gate 201 is coupled to the C(i) signal output portion of the monitor circuit 2(i).

A description will be given of an operation of each of the monitor circuits 2(i) of FIG. 3. First, the ring oscillator 202 oscillates in a predetermined cycle only during a period during which the ENABLE signal is in a HIGH state (i.e., "1"). The cycle will be hereinafter represented by "TROSC(i)". That is, a ROOUT signal outputted from the ring oscillator 202 is in a LOW state (i.e., "0") during a period during which the ENABLE signal is in the LOW state. However, during the period during which the ENABLE signal is in the HIGH state, the ROOUT signal is alternately and repeatedly brought into the LOW state and into the HIGH state. The period TROSC(i) is determined by the characteristics of the delay element 204 and the NAND circuit 205.

Next, the counter 203 receives the ROOUT signal, and measures the number of times that the ring oscillator 202 oscillated, i.e., the pulse number of the ROOUT signal. Here, the counter 203 needs to reset the measured number of times before starting counting of the number of pulses outputted from the ring oscillator 202. By receiving the RESET signal, the counter 203 performs the resetting. When it is assumed that a period during which the ENABLE signal shifts from the LOW state to the HIGH state, and returns to the LOW state is T, an output signal from the counter 203 has a binary value equal to a quotient obtained by dividing T by TROSC(i). The quotient will be hereinafter represented by "T/TROSC(i)", though, to be strict, it is necessary to truncate the digits after the decimal point, i.e., ignore the remainder. The output signal from the counter 203 remains the same until next time the RESET signal shifts to the HIGH state.

Finally, the AND gate 201 outputs T/TROSC(i) as C(i) when the G(i) signal is in the HIGH state, or outputs 0 as C(i) when the G(i) signal is in the LOW state. In other words, the G(i) signal functions as a gating signal for enabling or disabling an output of the monitor circuit 2(i). Here, it is assumed that each of the ROOUT signal and the C(i) signal is outputted as a binary value representing T/TROSC (i) with m digits or m bits, where m is a predetermined integer. Accordingly, the AND gate 201 is required to handle a m-bit value. For example, m AND gates may be used appropriately in parallel. However, in the present invention, the ROOUT signal and the C(i) signal need not be limited to such a form, and another form may also be used after various circuits are appropriately modified.

Figure 4:
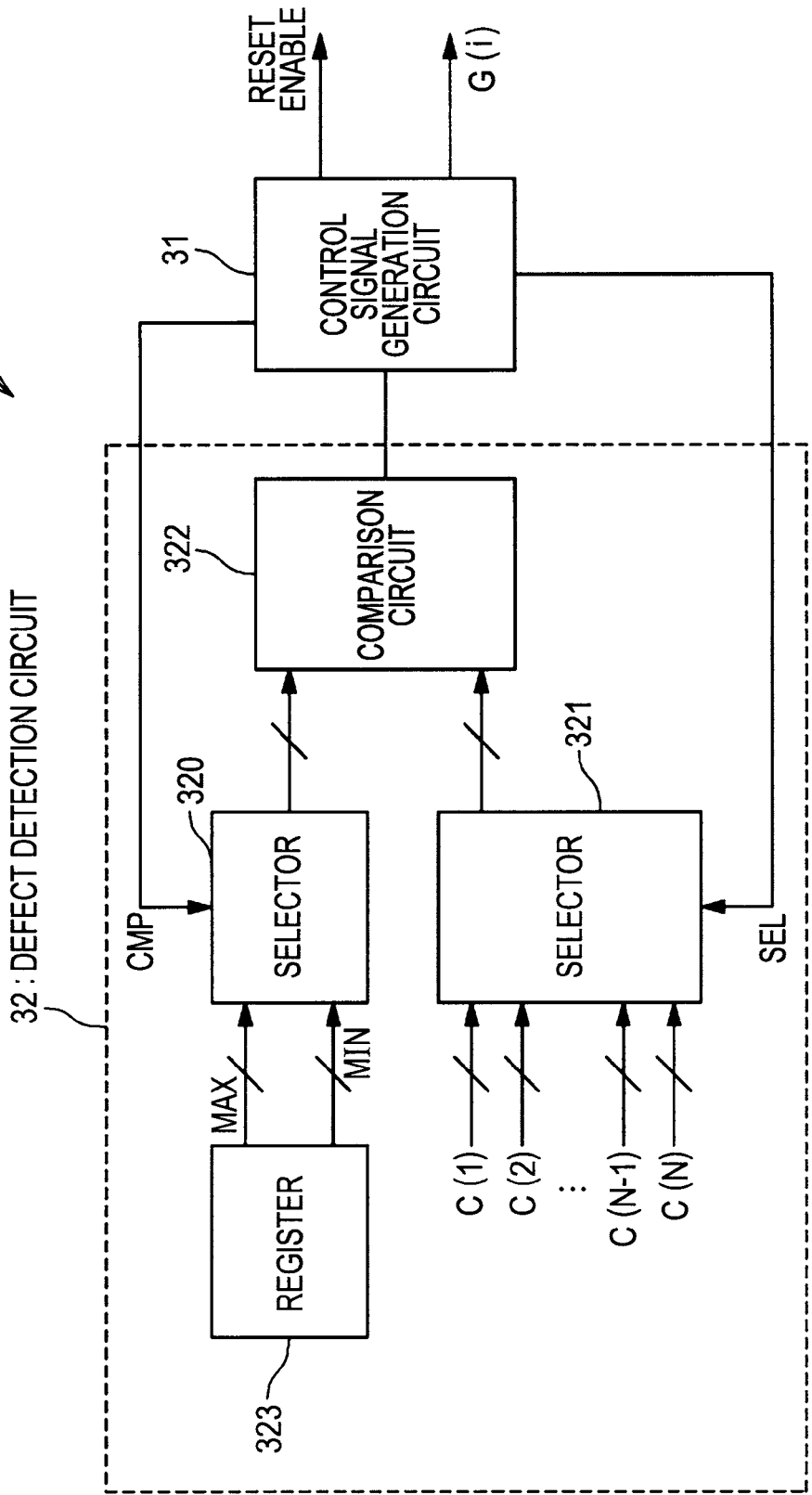
FIG. 4 is a block diagram showing a configuration of a control circuit according to the first embodiment of the present invention.

FIG. 4 is a block diagram showing a configuration of the control circuit 3 according to the first embodiment of the present invention. A description will be given of the components of the control circuit 3 of FIG. 4. The control circuit 3 of FIG. 4 includes a control signal generation circuit 31 and a defect detection circuit 32. Here, the defect detection circuit means a circuit having a function of detecting a monitor which does not operate normally. The defect detection circuit 32 includes a register 323, a selector 320, a selector 321, and a comparison circuit 322.

The register 323 includes a MAX signal output portion and a MIN signal output portion. The selector 320 includes a MAX signal input portion, a MIN signal input portion, a CMP signal input portion, and an output portion. The selector 321 includes N C(i) signal input portions, a SEL signal input portion, and an output portion. The comparison circuit 322 includes first and second input portions and an output portion. The control signal generation circuit 31 includes an input portion, a CMP signal output portion, a SEL signal output portion, a RESET signal output portion, an ENABLE signal output portion, and N G(i) signal output portions.

A description will be given of coupling relations between the components of the control circuit 3 of FIG. 4. The MAX signal output portion and the MIN signal output portion in the register 322 are respectively coupled to the MAX signal input portion and the MIN signal input portion in the selector 320. The N C(i) signal input portions of the control circuit 3 are respectively coupled to the N C(i) signal input portions of the selector 321. The output portion of the selector 320 is coupled to the first input portion of the comparison circuit 322. The output portion of the selector 321 is coupled to the second input portion of the comparison circuit 322. The output portion of the comparison circuit 322 is coupled to the input portion of the control signal generation circuit 31. The CMP signal output portion of the control signal generation circuit 31 is coupled to the CMP signal input portion of the selector 320. The SEL signal output portion of the control signal generation circuit 31 is coupled to the SEL signal input portion of the selector 321. The RESET signal output portion, the ENABLE signal output portion, and the G(i) signal output portion in the control signal generation circuit 31 are respectively coupled to the RESET signal output portion, the ENABLE signal output portion, and the G(i) signal output portion in the control circuit 3.

A description will be given of an operation of the control circuit 3 of FIG. 4. The register 323 stores a predetermined maximum value and a predetermined minimum value in the inside thereof. The register 323 outputs a MAX signal representing the maximum value and a MIN signal representing the minimum value toward the selector 320. The control signal generation circuit 31 outputs a selection signal CMP for selecting the maximum value or the minimum value toward the selector 320. The selector 320 outputs the MIN signal toward the comparison circuit 322 when the CMP signal is in the LOW state, or outputs the MAX signal toward the comparison circuit 322 when the CMP signal is in the HIGH state.

The control signal generation circuit 31 outputs a SEL signal toward the selector 321. The selector 321 selects any one of the N C(i) signals inputted from the N monitor circuits $2(i)$ in accordance with the SEL signal, and outputs the selected C(i) signal toward the comparison circuit 322.

The comparison circuit 322 compares the MAX signal or the MIN signal inputted thereto from the selector 320 with the C(i) signal inputted thereto from the selector 321, and outputs the result thereof toward the control signal generation circuit 31.

The control signal generation circuit 31 varies each of the CMP signal and the SEL signal in a predetermined range to check whether or not each of the N C(i) signals is not more than the predetermined maximum value and not less than the predetermined minimum value. Here, when MIN<C(i)<MAX is satisfied, the i-th monitor $2(i)$ is determined to be normally operating. Otherwise, the i-th monitor $2(i)$ is determined to be defective. The control signal generation circuit 31 outputs G(i) in the HIGH state when the i-th monitor $2(i)$ is normal, or outputs G(i) in the LOW state when the i-th monitor $2(i)$ is defective. The control signal generation circuit 31 also outputs the RESET signal and the ENABLE signal.

Figure 5:
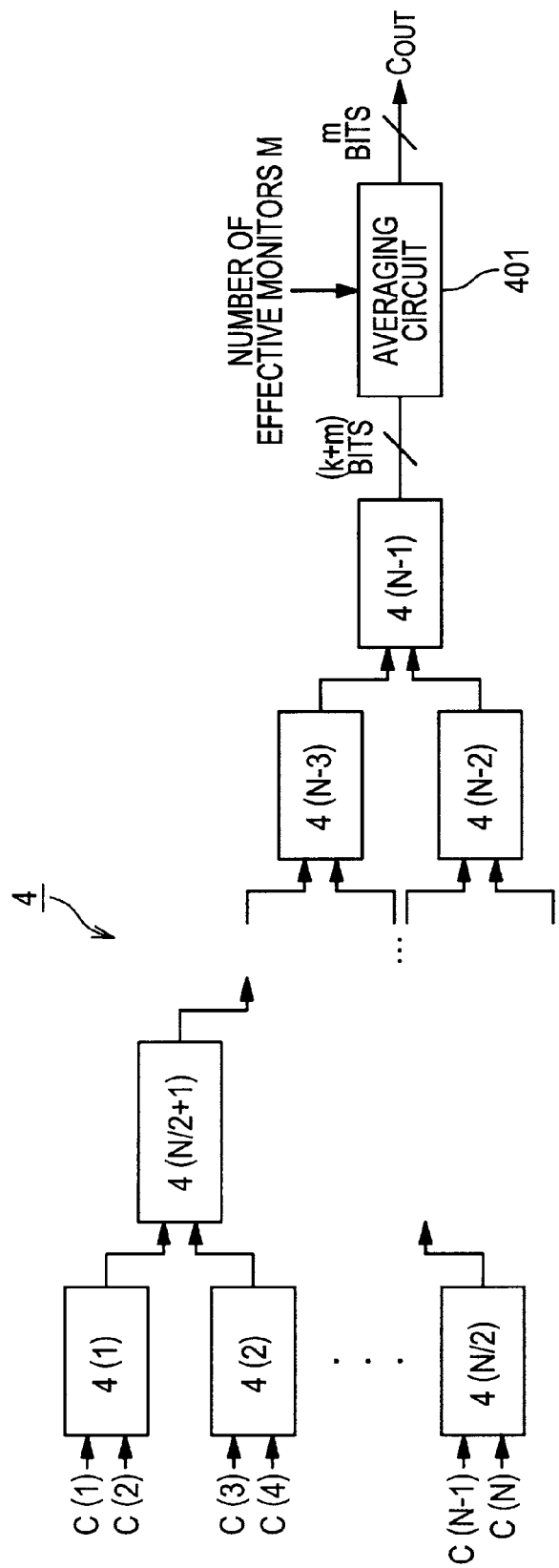
FIG. 5 is a block diagram showing a configuration of a summing circuit according to the first embodiment of the present invention.

FIG. 5 is a block diagram showing a configuration of the summing circuit 4 according to the first embodiment of the present invention. A description will be given of the components of the summing circuit 4 of FIG. 5. The summing circuit 4 of FIG. 5 includes (N−1) adders 4(1) to 4(N−1) and an averaging circuit 401. Each of the (N−1) adders $4(i)$ includes first and second input portions and an output portion. The averaging circuit 401 includes a first input portion, an M signal input portion, and a $C_{out}$ signal output portion. Note that, here, N is a power-of-2 number, and an exponent therefor is represented by k. That is, a description will be given of the case where $N=2^k$ is satisfied, and k is an integer of 0 or more. Other cases will be described later.

A description will be given of coupling relations between the components of the summing circuit 4 of FIG. 5. The (N−1) adders 4(1) to 4(N−1) are coupled in a positional relation of nodes forming a complete binary tree. Specifically, to start with, the first and second input portions of the first adder 4(1) are respectively coupled to the C(1) signal input portion and the C(2) signal input portion of the summing circuit 4. The first and second input portions of the second adder 4(2) are respectively coupled to the C(3) signal input portion and the C(4) signal input portion of the summing circuit 4. Subsequently, in the same manner as described above, the first and second input portions of the N/2-th adder 4(N/2) are respectively coupled to the C(N−1) signal input portion and the C(N) signal input portion of the summing circuit 4. The first to N/2-th adders 4(1) to 4(N/2) correspond to the leaves of the complete binary tree.

Next, the first and second input portions of the (N/2+1)-th adder 4(N/2+1) are coupled to the respective output portions of the first and second adders 4(1) and 4(2). The first and second input portions of the (N/2+2)-th adder 4(N/2+2) are coupled to the respective output portions of the third and fourth adders 4(3) and 4(4). Subsequently, in the same manner as described above, the first and second input portions of the adder 4(N/2+N/4) are coupled to the respective output portions of the (N−1)-th and N-th adders 4(N−1) and 4(N). The (N/2+1)-th to (N/2+N/4)-th adders 4(N/2) to 4(N/2+N/4) correspond to the nodes having the leaves of the complete binary tree.

Subsequently, in the same manner as described above, the (N/2+N/4+1)-th to (N−2)-th adders 4(N/2+N/4+1) to 4(N−2) correspond to the nodes of the complete binary tree. Finally, the first and second input portions of the (N−1)-th adder 4(N−1) are coupled to the output portions of the (N−3)-th and (N−2)-th adders 4(N−3) and 4(N−2). The (N−1)-th adder 4(N−1) corresponds to the root of the complete binary tree.

The first input portion, the M signal input portion, and the $C_{out}$ signal output portion of the averaging circuit 401 are respectively coupled to the output portion of the (N−1)-th adder 4(N−1), the M signal input portion of the summing circuit 4, and the $C_{out}$ signal output portion of the summing circuit 4.

A description will be given of an operation of the components of the summing circuit 4. Each of the adders $4(i)$ receives two data items, performs an addition therebetween, and outputs the result thereof. Since each of the C(i) signals inputted to the first to N/2-th adders 4(1) to 4(N/2) has a binary value represented by m bits, a signal outputted therefrom has a (m+1)-bit binary value. Likewise, each of the (N/2+1)-th to (N/2+N/4)-th adders 4(N/2+1) to 4(N/2+N/4) outputs a (m+2)-bit binary value, and the (N−1)-th adder 4(N−1) outputs a (m+k)-bit binary value. At this time, the (m+k)-bit binary value outputted from the (N−1)-th adder 4(N−1) is equal to the total sum of C(1) to C(N).

The averaging circuit 401 receives the (m+k)-bit binary value, shifts the received binary value to lower-order positions by k bits, and outputs an m-bit binary value. At this time, the m-bit binary value outputted from the averaging circuit 401 is equal to a quotient obtained by dividing the total sum of C(1) to C(N) by N. To be strict, the remainder of the division of the total sum of C(1) to C(N) by N is ignored, but this falls within an error range. Even when a $C_{out}$ signal thus obtained is assumed to be the average value of C(1) to C(N), there is substantially no problem.

The foregoing is the description of the operation of the summing circuit 4 when the total number of the effective C(i) signals is a power-of-2 number. When the total number of the effective C(i) signals is not a power-of-2 number, any of the effective C(i) signals is intentionally disabled to adjust the total number of the effective C(i) signals to a power-of-2 number. By setting the value of each of the disabled C(i) signals to 0, it is possible to eliminate influence on the total sum of C(1) to C(N). In addition, the number of bits by which the binary value is shifted to lower-order positions when the average value is calculated may be changed appropriately. Note that the number of bits by which the binary value is shifted is transmitted as the M signal representing the number of effective monitors from the control circuit 3 toward the averaging circuit 401. Here, the number of effective monitors means the number of monitors which are not determined to be defective, that is, the number of monitors which operate normally. It is preferable that which one of the effective C(i) signals is to be disabled is selectively determined by the control signal generation circuit 31 for generating the G(i) signals. However, the present invention need not necessarily be limited in such a manner.

For still another configuration of the summing circuit 4, a typical division circuit may also be used. In this case, the configuration of the summing circuit 4 is complicated, but an average value using all the effective monitor circuits $2(i)$ can be obtained.

Figure 6:
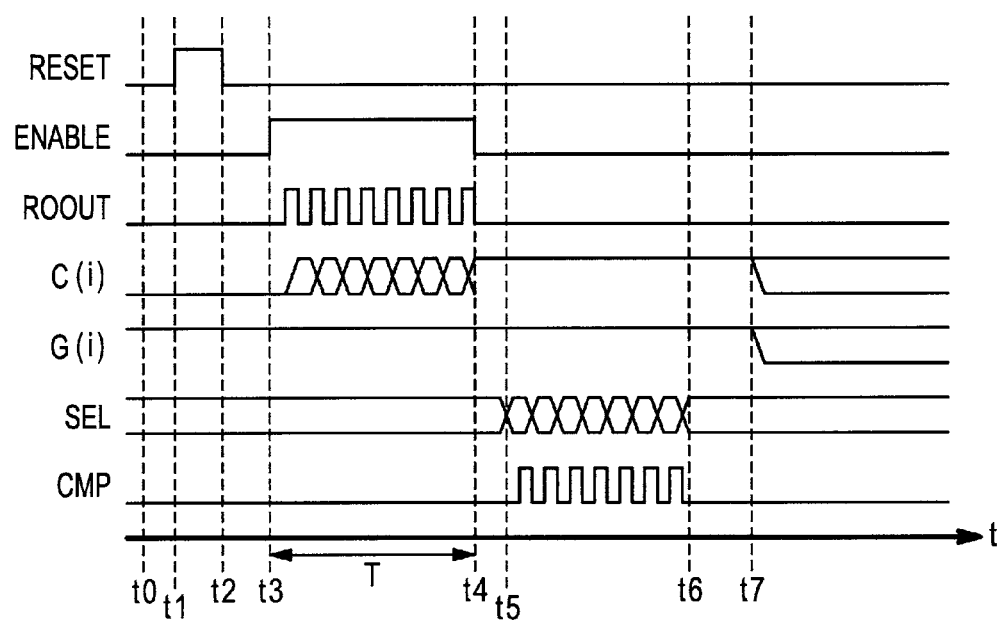
FIG. 6 is a time chart for illustrating an example of an operation of the semiconductor integrated circuit device according to the first embodiment of the present invention.

FIG. 6 is a time chart for illustrating an example of the operation of the semiconductor integrated circuit device 1 according to the first embodiment of the present invention. Along the time chart of FIG. 6, the example of the operation of the semiconductor integrated circuit device 1 according to the first embodiment of the present invention will be described.

The time chart of FIG. 6 shows graphs representing respective time variations in the RESET signal, the ENABLE signal, the ROOUT signal, the C(i) signal, the G(i) signal, the SEL signal, and the CMP signal in a descending order. In the time chart of FIG. 6, the abscissa axis represents elapsed time, and the ordinate axis represents the intensity of each of the signals.

The time t0 shows an initial state. At the time t0, RESET=0, ENABLE=0, and G(i)=1 are satisfied.

At the time t1, the RESET signal shifts to the HIGH state, and returns to the LOW state at the time t2. During the time period therebetween, the counter 203 is reset.

At the time t3, the ENABLE signal shifts to the HIGH state, and returns to the LOW state at the time t4. The time period from the time t3 to the time t4 is assumed to be T. During the time period, the ring oscillator 202 oscillates, the ROOUT signal are repeatedly and periodically brought into the LOW state and into the HIGH state, and the counter 203 measures the number of times that the ROOUT signal shifts to the HIGH state.

By performing the foregoing operation between the times t1 and t4 once, the C(i) signals are simultaneously determined in all the N monitor circuits 2(i).

During the time period from the time t5 to the time t6, the C(i) signals are sent to the selector 321, the CMP signal is repeatedly and alternately brought into the LOW state and into the HIGH state, and the SEL signal successively selects C(1) to C(N) to determine the effectiveness of each of the C(i) signals. As a result, when any of the monitor circuits 2(i) is determined to be defective, the corresponding G(i) signal shifts to the LOW state and, at the time t7, the C(i) signal is disabled, i.e., fixed to 0.

Thereafter, all the C(i) signals are sent to the summing circuit 4, and the summing circuit 4 outputs the average value of the effective C(i) signals.

Thus, by using the semiconductor integrated circuit device 1 according to the first embodiment of the present invention, the value obtained by averaging performance variations in the chip can be detected. This is because the multiple monitor circuits 2(i) disposed at mutually different locations in the chip perform performance evaluation independently of each other. In addition, since the monitor circuits 2(i) remaining after the exclusion of the monitor circuits 2(i) each showing an abnormal value perform monitor operations, the performance of the chip can be monitored with high accuracy.

Note that, heretofore, the average value of the C(i) signals outputted from the multiple monitor circuits 2(i) has been used, but it is also possible to use the minimum value of the C(i) signals instead. For this purpose, the configuration of the summing circuit 4 may be modified appropriately as follows.

Figure 7:
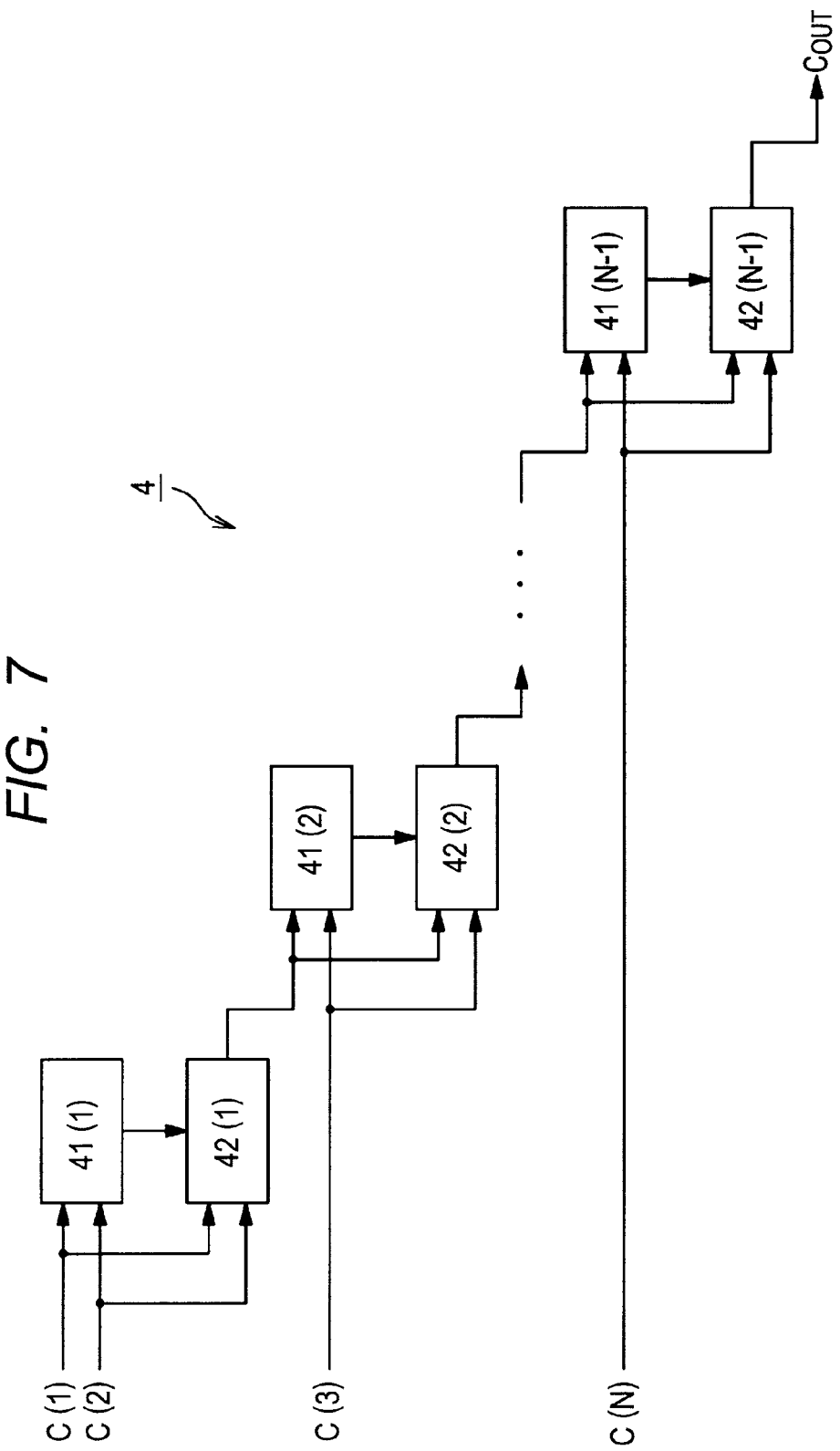
FIG. 7 is a block diagram showing another configuration of the summing circuit according to the first embodiment of the present invention.

FIG. 7 is a block diagram showing another configuration of the summing circuit 4 according to the first embodiment of the present invention. A description will be given of the components of the summing circuit 4 of FIG. 7. The summing circuit 4 of FIG. 7 includes (N−1) comparison circuits 41(i) and (N−1) selectors 42(i). Each of the (N−1) comparison circuits 41(i) includes first and second input portions and an output portion. Each of the (N−1) selectors 42(i) includes first to third input portions and an output portion.

A description will be given of coupling relations between the components of the summing circuit 4 of FIG. 7. The first and second input portions of each of the first comparison circuits 41(i) respectively receive the C(1) signal and the C(2) signal. The first, second, and third input portions of the first selector 42(1) respectively receive the C(1) signal, the C(2) signal, and an output signal from the first comparison circuit 41(1).

The first input portion of the second comparison circuit 41(2) receives an output signal from the first selector 42(1). The second input portion of the second comparison circuit 41(2) receives the C(3) signal. The first input portion of the second selector 42(2) receives an output signal from the first selector 42(1). The second input portion of the second selector 42(2) receives the C(3) signal. The third input portion of the second selector 42(2) receives an output signal from the second comparison circuit 41(2).

A generalized description will be given below in the range of $2<i<N-1$. The first input portion of the i-th comparison circuit 41(i) receives an output signal from the (i−1)-th selector 42(i−1). The second input portion of the i-th comparison circuit 41(i) receives the C(i+1) signal. The first input portion of the i-th selector 42(i) receives an output signal from the (i−1)-th selector 42(i−1). The second input portion of the i-th selector 42(i) receives the C(i+1) signal. The third input portion of the i-th selector 42(i) receives an output signal from the second comparison circuit 41(i).

Finally, the (N−1)-th selector 42(N−1) outputs the $C_{out}$ signal.

A description will be given of an operation of the summation circuit 4 of FIG. 7. Each of the (N−1) comparison circuits 41(i) compares the two signals inputted thereto, and outputs a signal representing the smaller one of the two signals as the result thereof toward the selector 42(i) having the same number. Each of the (N−1) selectors 42(i) responds to the signal inputted from the corresponding comparison circuit 41(i) to the third input portion thereof, and outputs the smaller one of the two signals inputted to the first and second input portions thereof toward the comparison circuit 41(i+1) having the next number. However, each of the selectors 42(i) needs to ignore the C(i) signal that has been disabled to satisfy C(i)=0, and select the other C(i) signal.

In the case of using the summing circuit 4 of FIG. 7, the semiconductor integrated circuit device 1 is allowed to detect the worst performance of the chip as the $C_{out}$ signal. Alternatively, each of the selectors 42(i) may also be adapted to output the larger value based on an output of the corresponding comparison circuit 41(i). This allows the maximum performance of the chip to be detected.

Second Embodiment

Figure 8:
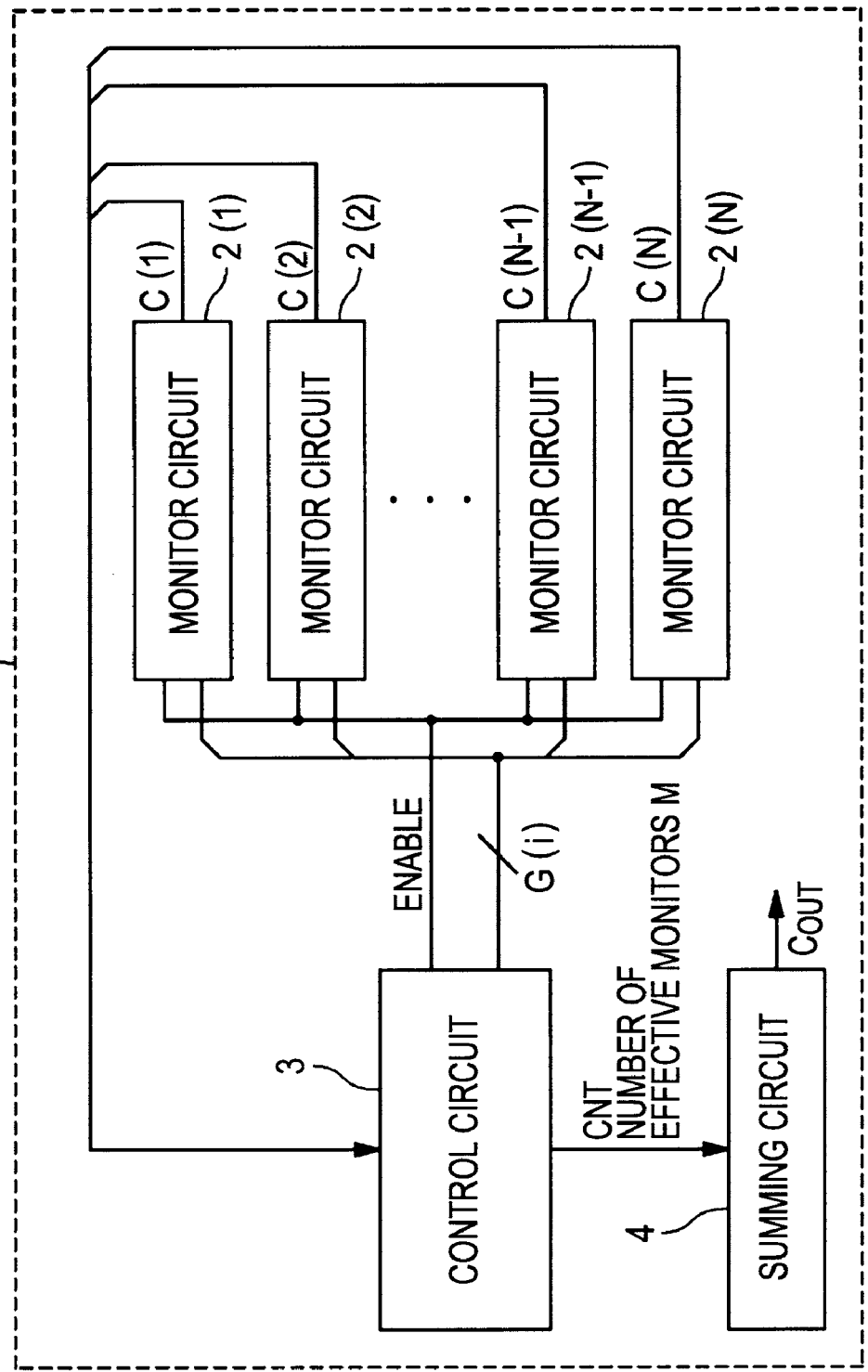
FIG. 8 is a block diagram showing a configuration of the semiconductor integrated circuit device according to a second embodiment of the present invention.

FIG. 8 is a block diagram showing a configuration of the semiconductor integrated circuit device 1 according to a second embodiment of the present invention. The semiconductor integrated circuit device of FIG. 8 is equivalent to the semiconductor integrated circuit device of the first embodiment of the present invention to which the following modification is added. That is, the summing circuit 4 does not include the C(i) signal input portions, and the C(i) signal output portions of the monitor circuits 2(i) are coupled only to the C(i) signal input portion of the control circuit 3. The control circuit 3 does not include the RESET signal output portion, and each of the monitor circuits 2(i) does not include the RESET signal input portion. The control circuit 3 includes a CNT signal output portion, and the summing circuit 4 includes a CNT signal input portion. The CNT signal output portion of the control circuit 3 is coupled to the CNT signal input portion of the summing circuit 4. The other components, coupling relations, and operations are the same as in the case of the first embodiment of the present invention, and therefore a further description is omitted.

Figure 9:
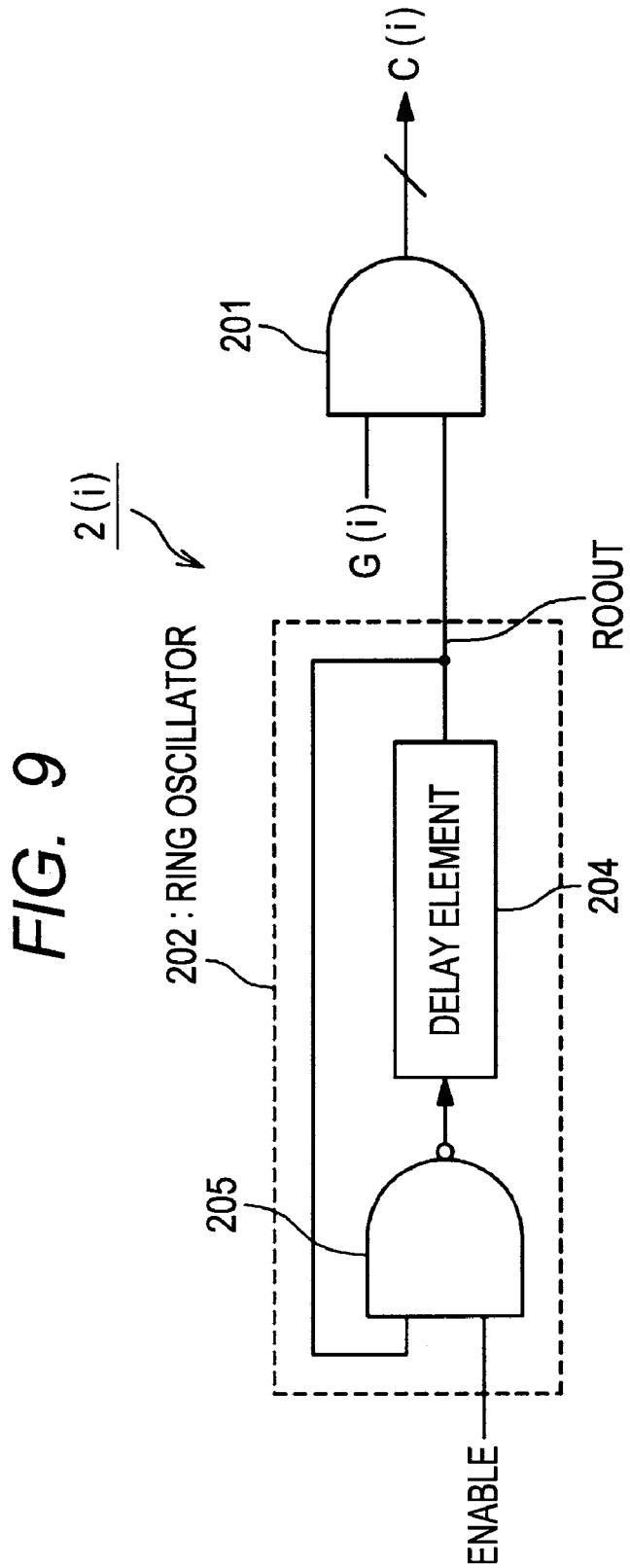
FIG. 9 is a block diagram showing a configuration of the monitor circuit according to the second embodiment of the present invention.

FIG. 9 is a block diagram showing a configuration of each of the monitor circuits 2(i) according to the second embodiment of the present invention. The monitor circuit 2(i) of FIG. 9 is equivalent to each of the monitor circuits 2(i) according to the first embodiment of the present invention to which the following modification is added. That is, the counter 203 is omitted, and the ROOUT signal output portion of the delay element 204 is coupled to the first input portion of the AND gate 201. The other components, coupling relations, and operations in the monitor circuit 2(i) of FIG. 9 are the same as in the case of the first embodiment of the present invention, and therefore a further description is omitted.

Figure 10:
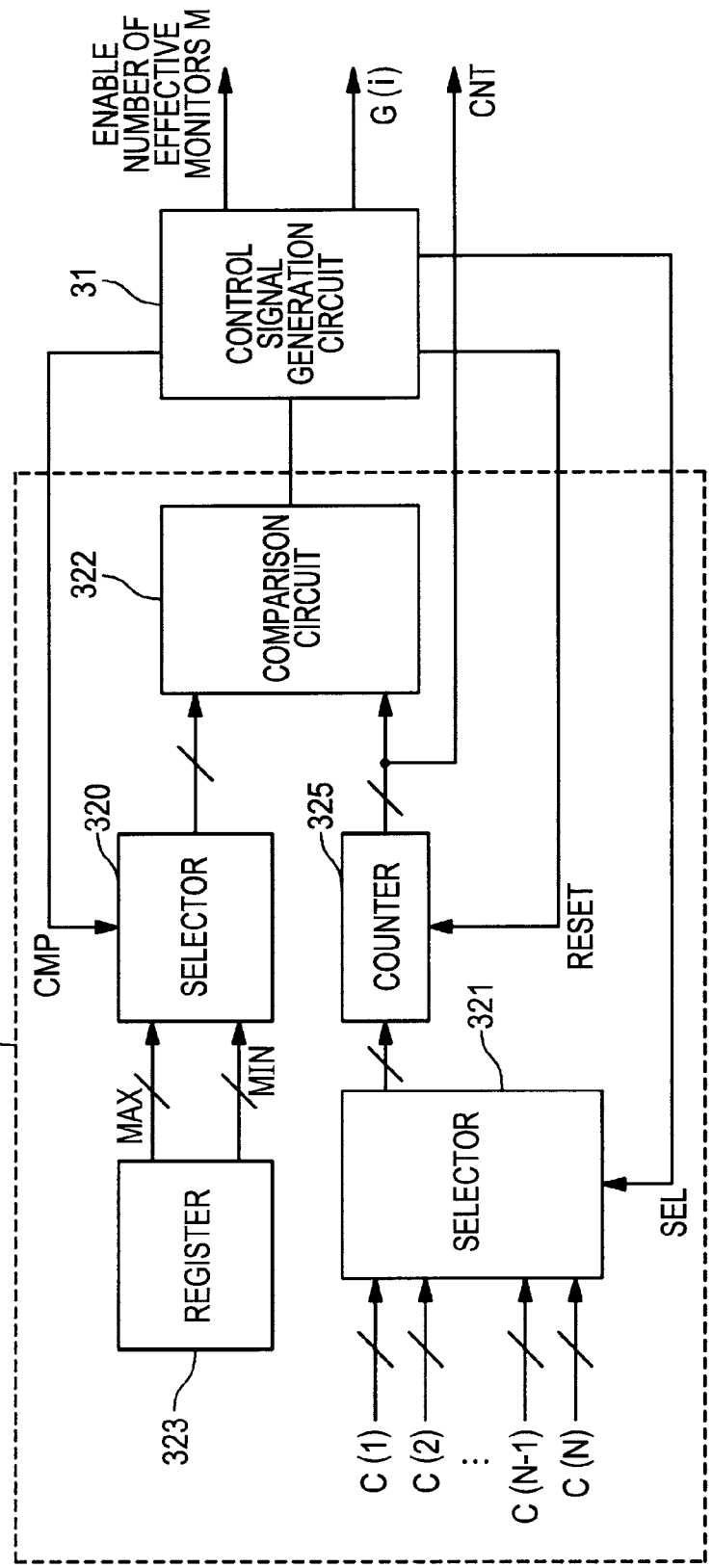
FIG. 10 is a block diagram showing a configuration of the control circuit according to the second embodiment of the present invention.

FIG. 10 is a block diagram showing a configuration of the control circuit 3 according to the second embodiment of the present invention. The control circuit 3 of FIG. 10 is equivalent to the control circuit 3 according to the first embodiment of the present invention to which the following modification is added. That is, between the output portion of the selector 321 and the second input portion of the comparison circuit 322, a counter 325 is additionally provided. Here, the counter 325 includes a first input portion, a RESET signal input portion, and an output portion, similarly to the counter 203 according to the first embodiment of the present invention. The output portion of the selector 321 is coupled to the first input portion of the counter 325. The RESET signal output portion of the control signal generation circuit 31 is coupled to the RESET signal input portion of the counter 325. The output portion of the counter 325 is coupled to the second input portion of the comparison circuit 322 and to the CNT signal output portion of the control circuit 3.

The counter 325 has two functions. The first function of the counter 325 is the measurement of the number of times that the ROOUT signal outputted from the ring oscillator 202 shifts to the HIGH state, similarly to the function of the counter 203 according to the first embodiment of the present invention. The counter 325 performs the first function, while checking the effectiveness of each of the C(i) signals, i.e., whether or not MIN<C(i)<MAX is satisfied. The second function of the counter 325 is the calculation of the total sum of the C(i) signals. After the effectiveness of each of the C(i) signals is checked, for the calculation of the average value of the effective C(i) signals, the total sum thereof is needed. The control signal generation circuit 31 successively specifies only the C(i) signals corresponding to all the G(i) signals that are in the HIGH state with the SEL signal, thereby allowing the counter 325 to calculate the total sum of the effective C(i) signals. The counter 325 outputs the total sum of the effective C(i) signals as a CNT signal toward the summing circuit 4. The other components, coupling relations, and operations are the same as in the case of the first embodiment of the present invention, and therefor a further description is omitted.

The summing circuit 4 according to the second embodiment of the present invention is equivalent to the summing circuit 4 according to the first embodiment of the present invention from which the comparison circuits 41(i) and the selectors 42(i) are removed. That is, the summing circuit 4 according to the second embodiment of the present invention is equivalent to the averaging circuit 401 according to the first embodiment of the present invention. The configuration thereof is so simple that the depiction thereof is omitted. The summing circuit 4 according to the second embodiment of the present invention, i.e., the averaging circuit 401 receives the CNT signal at the first input portion thereof. The other coupling relations and operations are the same as in the first embodiment, and therefor a further description is omitted.

Figure 11:
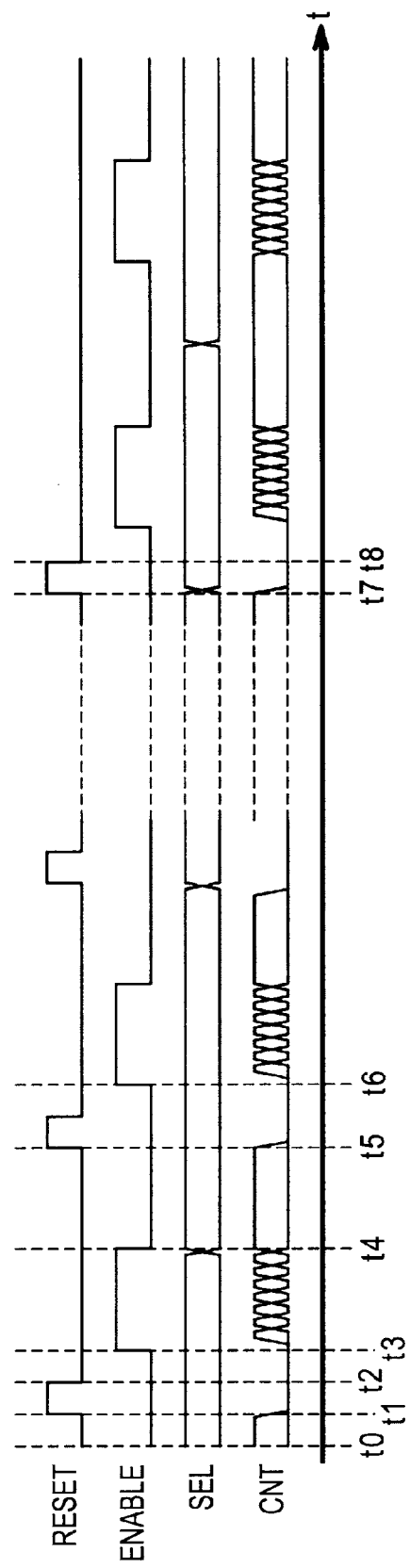
FIG. 11 is a time chart for illustrating an operation of the semiconductor integrated circuit device according to the second embodiment of the present invention.

FIG. 11 is a time chart for illustrating an operation of the semiconductor integrated circuit device 1 according to the second embodiment of the present invention. Along the time chart of FIG. 11, an example of the operation of the semiconductor integrated circuit device 1 according to the second embodiment of the present invention will be described.

The time chart of FIG. 11 shows graphs representing respective time variations in the RESET signal, the ENABLE signal, the SEL signal, and the CNT signal in a descending order. In the time chart of FIG. 11, the abscissa axis represents elapsed time, and the ordinate axis represents the intensity of each of the signals.

The time t0 shows an initial state. At the time t0, RESET=0 and ENABLE=0 are satisfied. At this time, the G(i) signal not shown is preferably in the HIGH state.

At the time t1, the RESET signal shifts to the HIGH state, and returns to the LOW state at the time t2. During the time period therebetween, the counter 325 is reset to satisfy CNT=0.

Before the time t3, the control signal generation circuit outputs the SEL signal for selecting any of the monitor circuits 2(i).

At the time t3, the ENABLE signal shifts the HIGH state, and returns to the LOW state at the time t4. During the time period from the time t3 to the time t4, the ring oscillator 202 oscillates in each of the monitor circuit 2(i). The ROOUT signal outputted from the ring oscillator 202 is outputted as the C(i) signal from the monitor circuit 2(i) via the AND gate 201 to which the G(i) signal in the HIGH state is inputted. At this time, only the C(i) signal outputted from the one monitor circuit 2(i) selected with the SEL signal has the pulse number thereof measured by the counter 325.

At the time t4, the oscillation of the ring oscillator 202 ends, and the number of counts of the counter 325 becomes T/TROSC, where T represents the time period from the time t3 to the time t4, and TROSC represents the oscillation period of the ring oscillator 202.

After the time t4, the control signal generation circuit 31 switches the LOW state and the HIGH state of the CMP signal to allow the comparison circuit 322 to compare the C(i) signal with MIN or MAX. When the result of MAX<C(i) or C(i)<MIN is obtained, the monitor circuit 2(i) that has outputted the C(i) signal is determined to be defective. To disable the monitor circuit 2(i) determined to be defective, the control signal generation circuit 31 brings the G(i) signal into the LOW sate.

Subsequently, the control signal generation circuit 31 appropriately changes the SEL signal to repeat the defect detection described above for each of the monitor circuits 2(i). For example, the times t5 and t6 respectively correspond to the times t1 and t3.

Next, at the time t7, the control signal generation circuit 31 brings the RESET signal into the HIGH state to reset the counter 325. Note that, at the time t8 and thereafter, there is no need to bring the RESET signal into the HIGH state. Thereafter, the control signal generation circuit 31 selects each of the monitor circuits 2(i) one by one with the SEL signal, while repeatedly switching the HIGH state and the LOW state of the ENABLE signal. While the ENABLE signal remains in the HIGH state only for the same period T as mentioned above, each of the ring oscillators 202 oscillates, and the counter 325 counts the pulse number of the C(i) signal of the monitor circuit selected with the SEL signal. Finally, the pulse number of the C(i) signal of each of the monitor circuits 2(i) determined to be effective, i.e., the G(i) signal of which remains in the HIGH state is counted. During the counting, the counter 325 is not reset halfway so that the CNT signal outputted from the counter 235 becomes equal to the total sum of the pulse numbers of the C(i) signals of the effective monitor circuits 2(i).

Finally, the summing circuit 4 divides the value of the CNT signal by the value of the M signal representing the total sum of the effective monitor circuits 2(i) to provide the average value of the C(i) signals of the effective monitor circuits 2(i). Here, in the same manner as in the first embodiment, a shift operation may also be performed instead of the division by targeting only those of the M effective monitor circuits $2(i)$ the total number of which is a power-of-number, and ignoring the other effective monitor circuits $2(i)$.

In the second embodiment of the present invention also, in the same manner as in the first embodiment of the present invention, the monitor circuits disposed at multiple locations in a chip can allow a value obtained by averaging performance variations in the chip to be detected. In the same manner as in the first embodiment of the present invention, since the monitor circuits $2(i)$ remaining after the exclusion of the monitor circuits $2(i)$ each showing an abnormal value perform monitor operations, the performance of the chip can be monitored with high accuracy. Additionally, in the second embodiment of the present invention, the number of the counter 325 that is needed is only one. Therefore, compared with the case of the first embodiment of the present invention, the area of the semiconductor integrated circuit device 1 can be saved.

Third Embodiment

Figure 12:
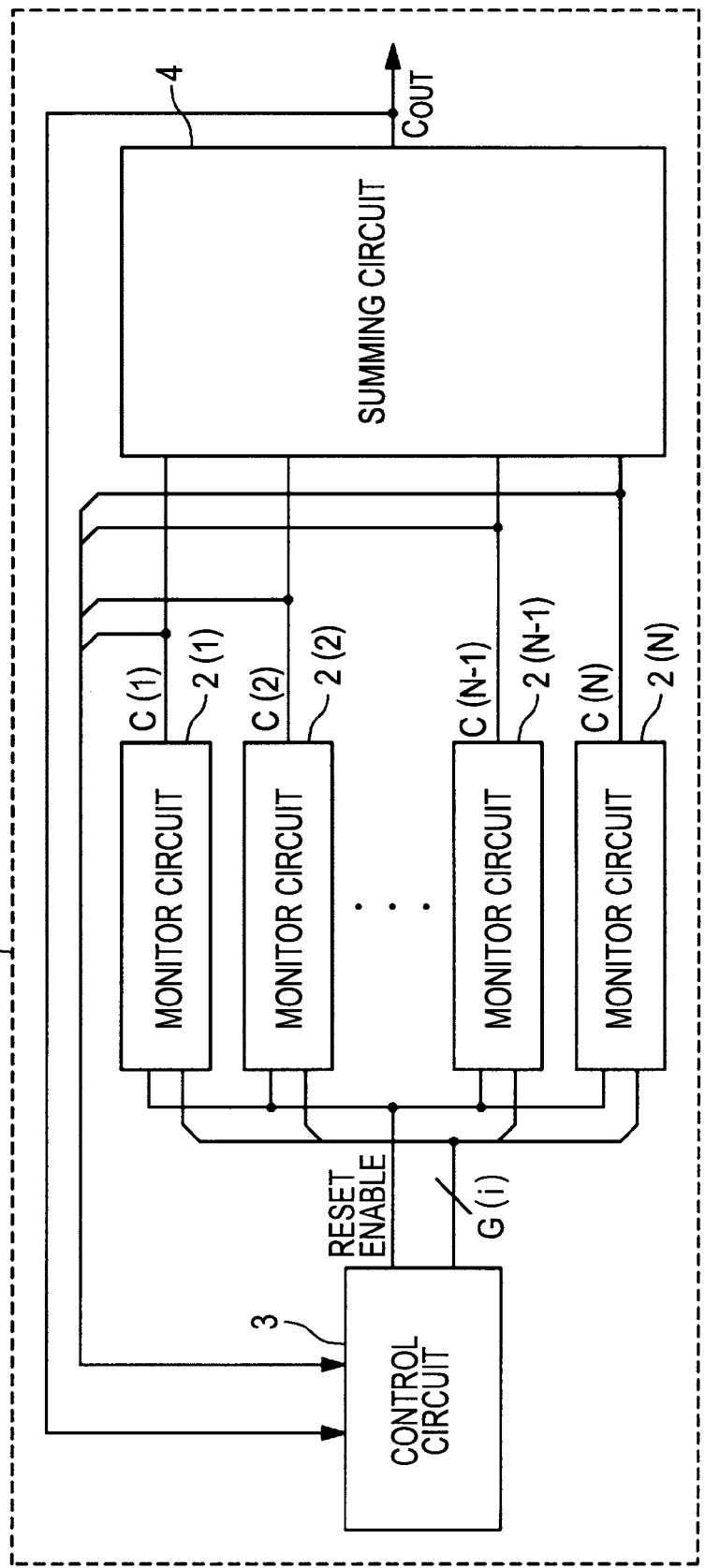
FIG. 12 is a block diagram showing a configuration of the semiconductor integrated circuit device according to a third embodiment of the present invention.

FIG. 12 is a block diagram showing a configuration of the semiconductor integrated circuit device 1 according to a third embodiment of the present invention. The semiconductor integrated circuit device 1 of FIG. 12 is equivalent to the semiconductor integrated circuit device 1 according to the first embodiment of the present invention to which the following modification is added. That is, the control circuit does not include the M signal output portion, and the summing circuit 4 does not include the M signal input portion. The control circuit 3 includes a $C_{out}$ signal input portion, and the $C_{out}$ signal output portion of the summing circuit 4 is coupled to the $C_{out}$ signal input portion of the control circuit 3. The other components, coupling relations, and operations are the same as in the case of the first embodiment of the present invention, and therefore a further description is omitted.

A configuration of each of the monitor circuits $2(i)$ according to the third embodiment of the present invention is the same as in the case of the first embodiment of the present invention, and therefore a further description and depiction are omitted.

Figure 13:
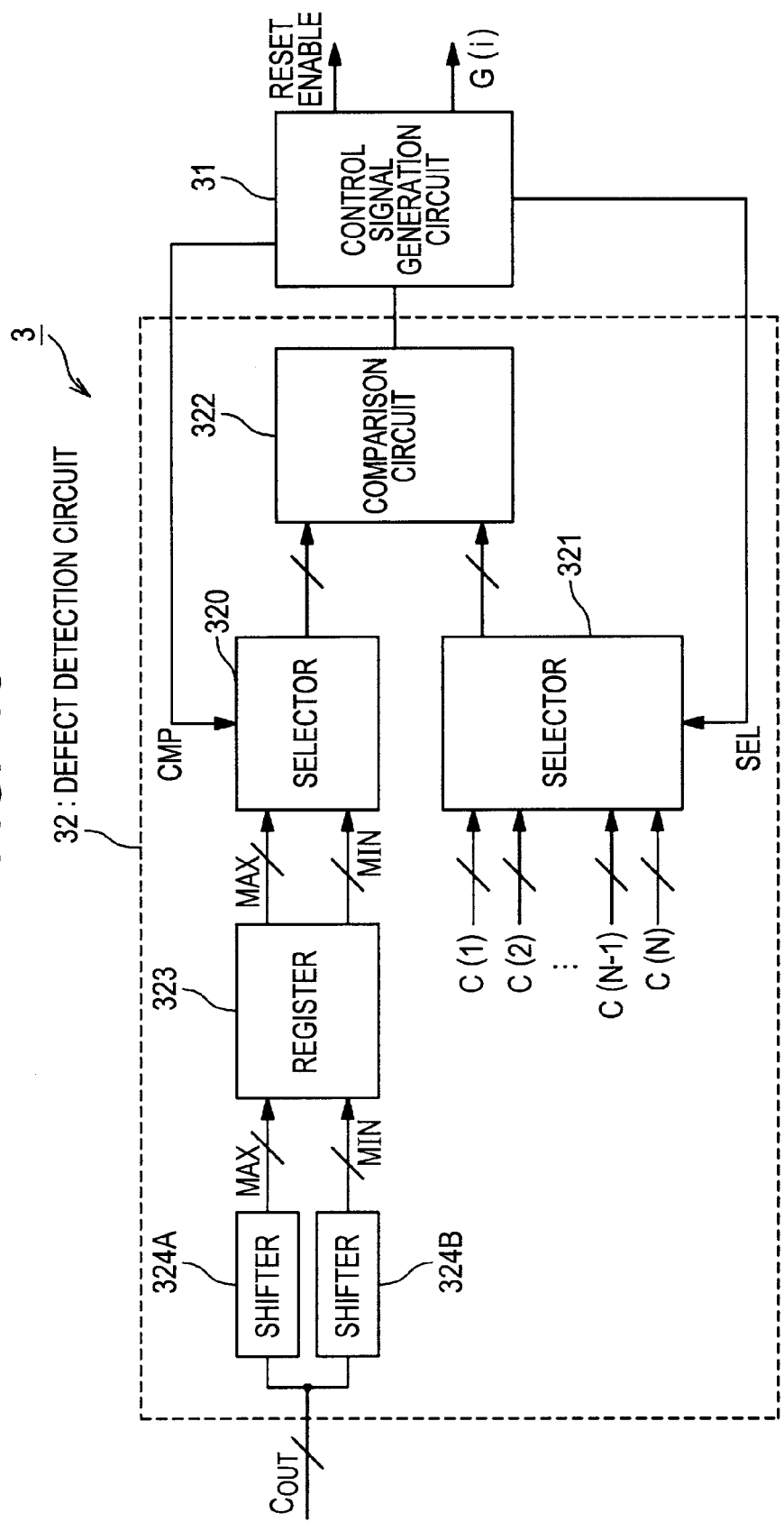
FIG. 13 is a block diagram showing a configuration of the control circuit according to the third embodiment of the present invention.

FIG. 13 is a block diagram showing a configuration of the control circuit 3 according to the third embodiment of the present invention. The control circuit 3 of FIG. 13 is equivalent to the control circuit 3 according to the first embodiment of the present invention to which the following modification is added. That is, the control circuit 3 according to the third embodiment of the present invention further includes a shifter 324A and a shifter 324B. The shifter 324A includes a $C_{out}$ signal input portion and a MAX signal output portion. The shifter 324B includes a $C_{out}$ signal input portion and a MIN signal output portion. The register 323 further includes a MAX signal input portion and a MIN signal input portion.

The $C_{out}$ signal input portions of the shifter 324A and the shifter 324B are coupled to the $C_{out}$ signal input portion of the control circuit 3. The MAX signal input portion of the shifter 324A is coupled to the MAX signal input portion of the register 323. The MIN signal input portion of the shifter 324B is coupled to the MIN signal input portion of the register 323.

In the first and second embodiments of the present invention, the values of the MAX signal and the MIN signal stored in the register 323 are fixed values. However, in the third embodiment of the present invention, the values of the MAX signal and the MIN signal vary in accordance with the value of the $C_{out}$ signal outputted from the summing circuit 4.

Here, by way of example, it is assumed that MAX=$2 \times C_{out}$ and MIN=$C_{out}/2$ are satisfied. Since the $C_{out}$ signal has a binary value, the shifter 324A can generate the MAX signal by shifting the $C_{out}$ signal to a 1-digit higher-order position. Likewise, the shifter 324B can generate the MIN signal by shifting the $C_{out}$ signal to a 1-digit lower-order position. The other components, coupling relations, and operations are the same as in the case of the first embodiment of the present invention, and therefore a further description is omitted.

Note that the values of the MAX signal and the MIN signal may also be other than double the value and half the value of the $C_{out}$ signal. However, in that case, the shifter 324A and the shifter 324B need to be replaced with typical arithmetic circuits or the like.

Figure 14:
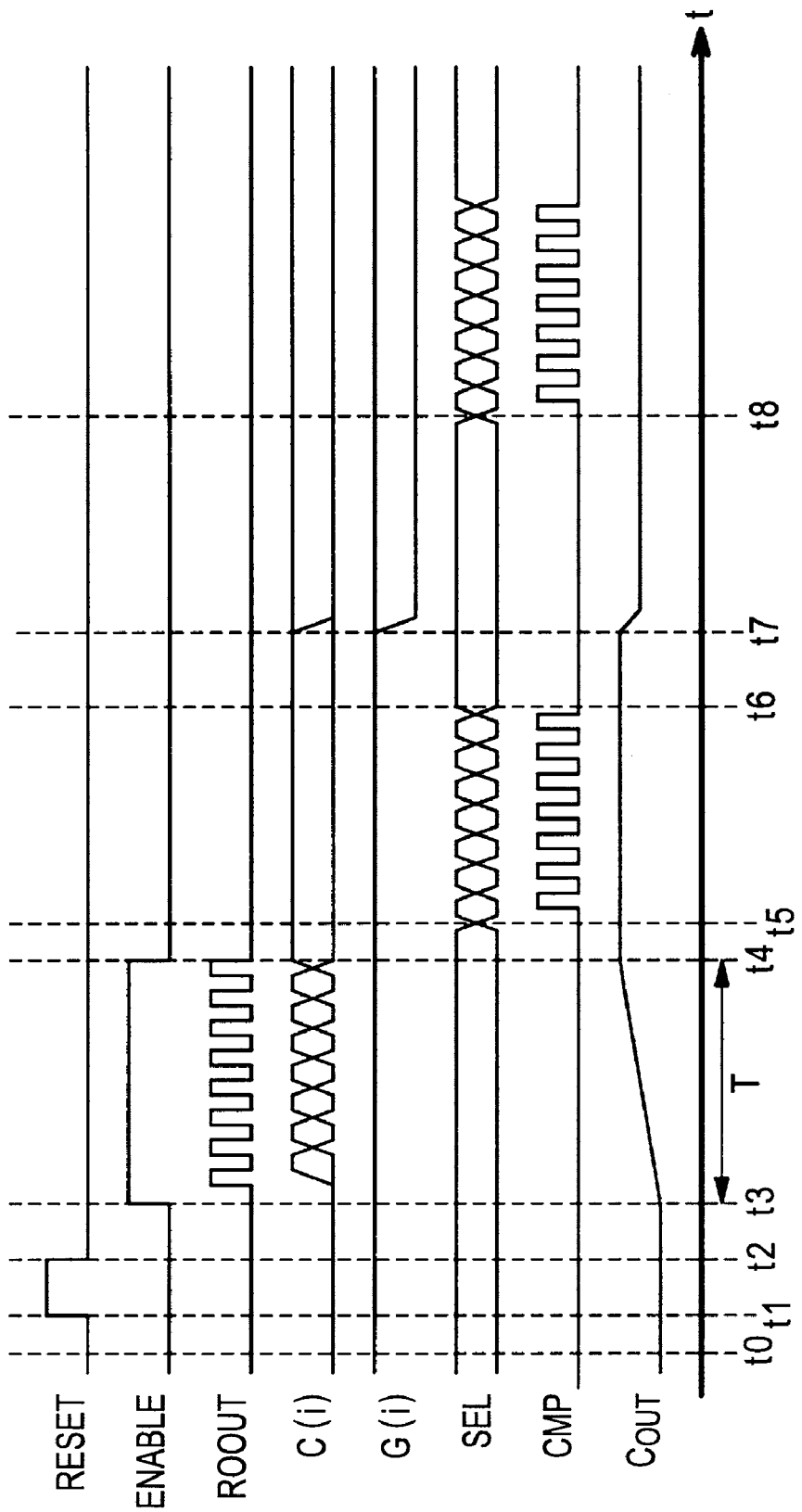
FIG. 14 is a time chart for illustrating an operation of the semiconductor integrated circuit device according to the third embodiment of the present invention.

FIG. 14 is a time chart for illustrating an operation of the semiconductor integrated circuit device 1 according to the third embodiment of the present invention. The time chart of FIG. 14 includes graphs representing respective time variations in the RESET signal, the ENABLE signal, the ROOUT signal, the C(i) signal, the G(i) signal, the SEL signal, the CMP signal, and the $C_{out}$ signal in a descending order. In each of the graphs of the time chart of FIG. 14, the horizontal direction indicates elapsed time, and the vertical direction indicates the intensity of each of the signals.

In the time chart of FIG. 14, an operation from the time t0 to the time t7 is the same as in the case of the first embodiment of the present invention. During the time period therebetween, when any of the monitor circuits $2(i)$ is determined to be defective to satisfy G(i)=0, the value of the $C_{out}$ signal also undergoes a change so that the operation from the time t0 to the time t7 is repeated from the time t8. Finally, the value of the $C_{out}$ signal when no more change occurs is assumed to the average value of the values of the C(i) signals of the effective monitor circuits.

Thus, by using the semiconductor integrated circuit device 1 according to the third embodiment of the present invention, the value obtained by averaging performance variations in the chip can be detected. This is because the multiple monitor circuits $2(i)$ disposed at mutually different locations in a chip perform performance evaluation independently of each other. In addition, since the monitor circuits $2(i)$ remaining after the exclusion of the monitor circuits $2(i)$ each showing an abnormal value perform monitor operations, the performance of the chip can be monitored with high accuracy. Moreover, since a threshold value for determining a defect is calculated from the average value of the values of the signals from the individual monitor circuits, there is no need to predetermine the threshold value.

Fourth Embodiment

Figure 15:
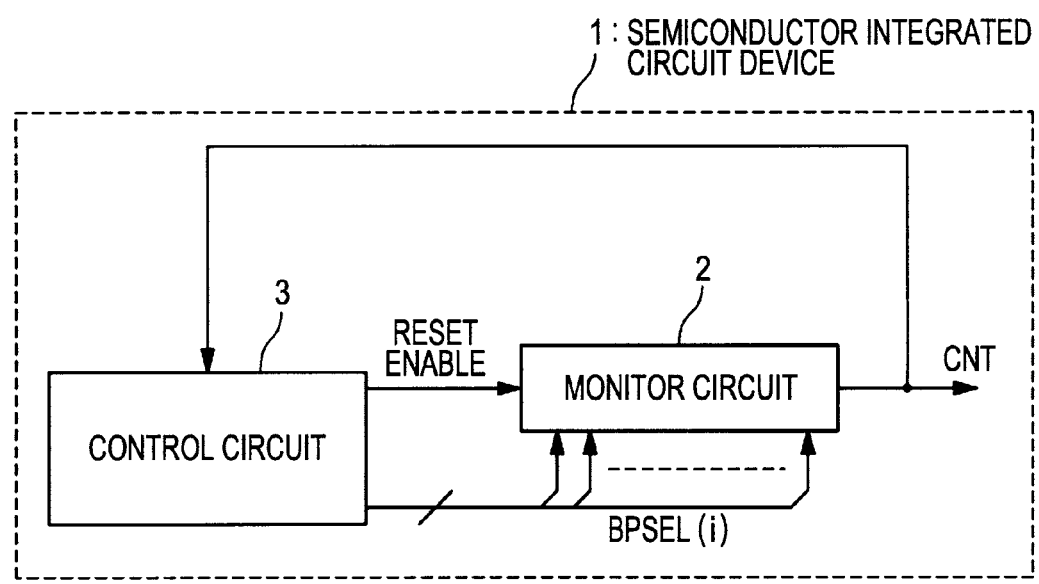
FIG. 15 is a block diagram showing a configuration of the semiconductor integrated circuit device according to a fourth embodiment of the present invention.

FIG. 15 is block diagram showing a configuration of the semiconductor integrated circuit device 1 according to a fourth embodiment of the present invention. A description will be given of the components of the semiconductor integrated circuit device 1 of FIG. 15. The semiconductor integrated circuit device 1 of FIG. 15 includes a monitor circuit 2 and the control circuit 3. The monitor circuit 2 includes a RESET signal input portion, an ENABLE signal input portion, m BPSEL(i) signal input portions, and a CNT signal output portion. The control circuit 3 includes a CNT signal input portion, a RESET signal output portion, an ENABLE signal output portion, and m BPSEL(i) signal output portions. Note that m is a predetermined integer of 2 or more, and the meaning thereof will be described later. Here, "i" is assumed to be any integer included in the range of 1 to m.

The semiconductor integrated circuit device 1 of FIG. 15 preferably further includes the summing circuit 4 not shown.

A configuration of the summing circuit 4 is preferably the same as in the case of the third embodiment of the present invention.

A description will be given of coupling relations in the semiconductor integrated circuit device of FIG. 15. The RESET signal output portion, the ENABLE signal output portion, and the m BPSEL(i) signal output portions of the control circuit 3 are respectively coupled to the RESET signal input portion, the ENABLE signal input portion, and the m BPSEL(i) signal input portions of the monitor circuit 2. The CNT signal output portion of the monitor circuit 2 is coupled to the CNT signal input portion of the control circuit 3.

The CNT signal output portion of the monitor circuit 2 is preferably coupled to the CNT signal input portion of the summing circuit 4 not shown.

Figure 16:
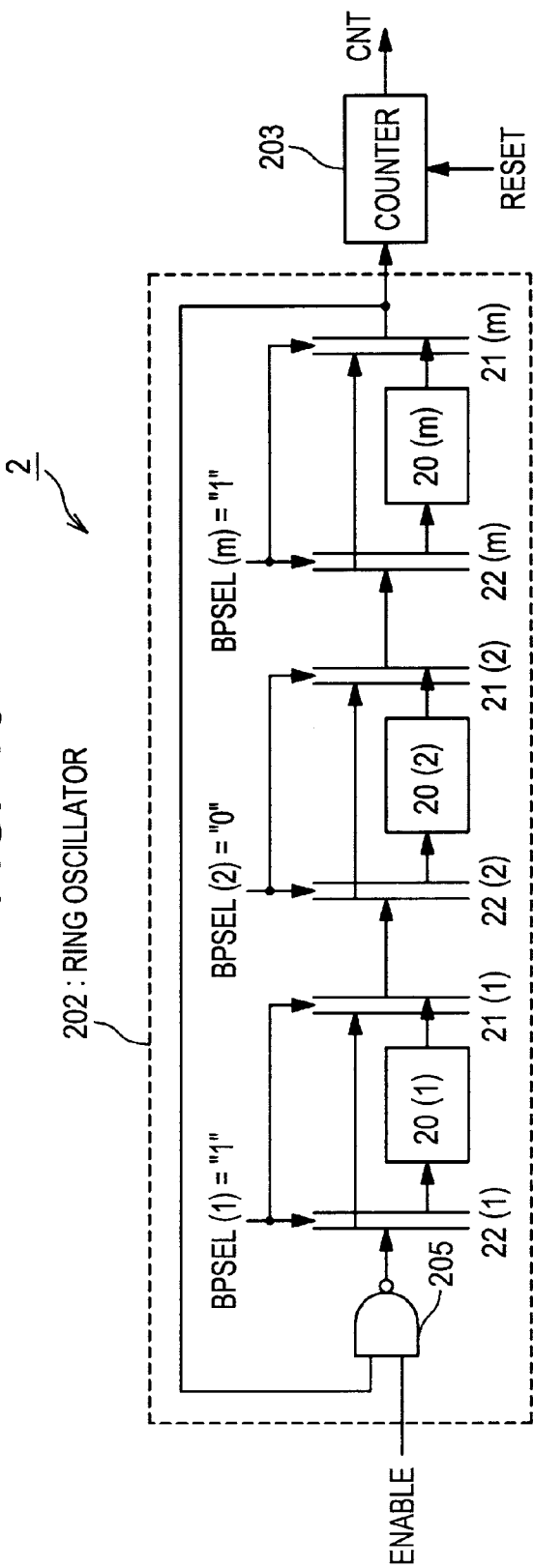
FIG. 16 is a block diagram showing a configuration of the monitor circuit according to the fourth embodiment of the present invention.

FIG. 16 is a block diagram showing a configuration of the monitor circuit 2 according to the fourth embodiment of the present invention. A description will be given of the components of the monitor circuit 2 of FIG. 16. The monitor circuit 2 of FIG. 16 includes the ring oscillator 202 and the counter 203. The ring oscillator 202 includes an ENABLE signal input portion, the NAND gate 205, m delay elements 20(i), m rear selectors 21(i), m front selectors 22(i), and a ROOUT signal output portion. The counter 203 includes a ROOUT signal input portion, a RESET signal input portion, and a CNT signal output portion. The NAND gate 205 includes an ENABLE signal input portion, a ROOUT signal input portion, and an output portion. Each of the front selectors 22(i) includes a first input portion, a BPSEL (i) signal input portion, and first and second output portions. Each of the delay elements 20(i) includes an input portion and an output portion. Each of the rear selectors 21(i) includes first and second input portions, a BPSEL (i) signal input portion, and an output portion.

A description will be given of coupling relations in the monitor circuit 2 of FIG. 16. The ENABLE signal input portion of the monitor circuit 2 is coupled to the ENABLE signal input portion of the ring oscillator 202. The ENABLE signal input portion of the ring oscillator 202 is coupled to the ENABLE signal input portion of the NAND gate 205. The output portion of the NAND gate 205 is coupled to the first input portion of the first front selector 22(1). The first output portion of the first front selector 22(1) is coupled to the first input portion of the first rear selector 21(1). The second output portion of the first front selector 22(1) is coupled to the input portion of the first delay element 20(1). The output portion of the first delay element 20(1) is coupled to the second input portion of the first rear selector 21(1). The output portion of the first rear selector 21(1) is coupled to the first input portion of the second front selector 22(2).

In the same manner as described above, a generalized description will be given below using a suffix i The first output portion of the i-th front selector 22(i) is coupled to the first input portion of the i-th rear selector 21(i). The second output portion of the i-th front selector 22(i) is coupled to the input portion of the i-th delay element 20(i). The output portion of the i-th delay element 20(i) is coupled to the second input portion of the i-th rear selector 21(i). The output portion of the i-th rear selector 21(i) is coupled to the first input portion of the (i+1)-th front selector 22(i+1). The respective BPSEL(i) signal input portions of the i-th front selector 22(i) and the i-th rear selector 21(i) are each coupled to the BPSEL(i) signal input portion of the monitor circuit 2.

Finally, the first output portion of the m-th front selector 22(m) is coupled to the first input portion of the m-th rear selector 21(m). The second output portion of the m-th front selector 22(m) is coupled to the input portion of the m-th delay element 20(m). The output portion of the m-th delay element 20(m) is coupled to the second input portion of the m-th rear selector 21(m). The output portion of the m-th rear selector 21(m) is coupled to the ROOUT signal output portion of the ring oscillator 202 and to the ROOUT signal input portion of the NAND gate 205. The ROOUT signal output portion of the ring oscillator 202 is coupled to the ROOUT signal input portion of the counter 203. The RESET signal input portion of the counter 203 is coupled to the RESET signal input portion of the monitor circuit 2. The CNT signal output portion of the counter 203 is coupled to the CNT signal output portion of the semiconductor integrated circuit device 1.

A description will be given of an operation of the monitor circuit 2 of FIG. 16. Between each of the front selectors 22(i) and the corresponding rear selector 21(i), there are a first path passing through the corresponding delay element 20(i) and a second path bypassing the delay element 20(i). The front selector 22(i) and the rear selector 21(i) switch the couplings of the input portions and the output portions thereof in accordance with a BPSEL(i) signal to thereby switch the first and second paths. Specifically, when the BPSEL(i) signal is in the HIGH state, the path passing through the delay element 20(i) is selected and, when the BPSEL(i) signal is in the LOW state, the delay element 20(i) is bypassed.

As will be described later, the BPSEL(i) signal shifts to the LOW state with only one i at a time, and shifts to the HIGH state with the other i's. That is, the delay element 20(i) bypassed at a time is only one. When the ENABLE signal shifts to the HIGH state, the ring oscillator 202 oscillates in a state where the remaining (m−1) delay elements 20(i) are coupled in series.

The counter 203 counts the pulse number of the ROOUT signal outputted from the ring oscillator 202. The count of the counter 203 is reset by the shifting of the RESET signal to the HIGH state.

Figure 17:
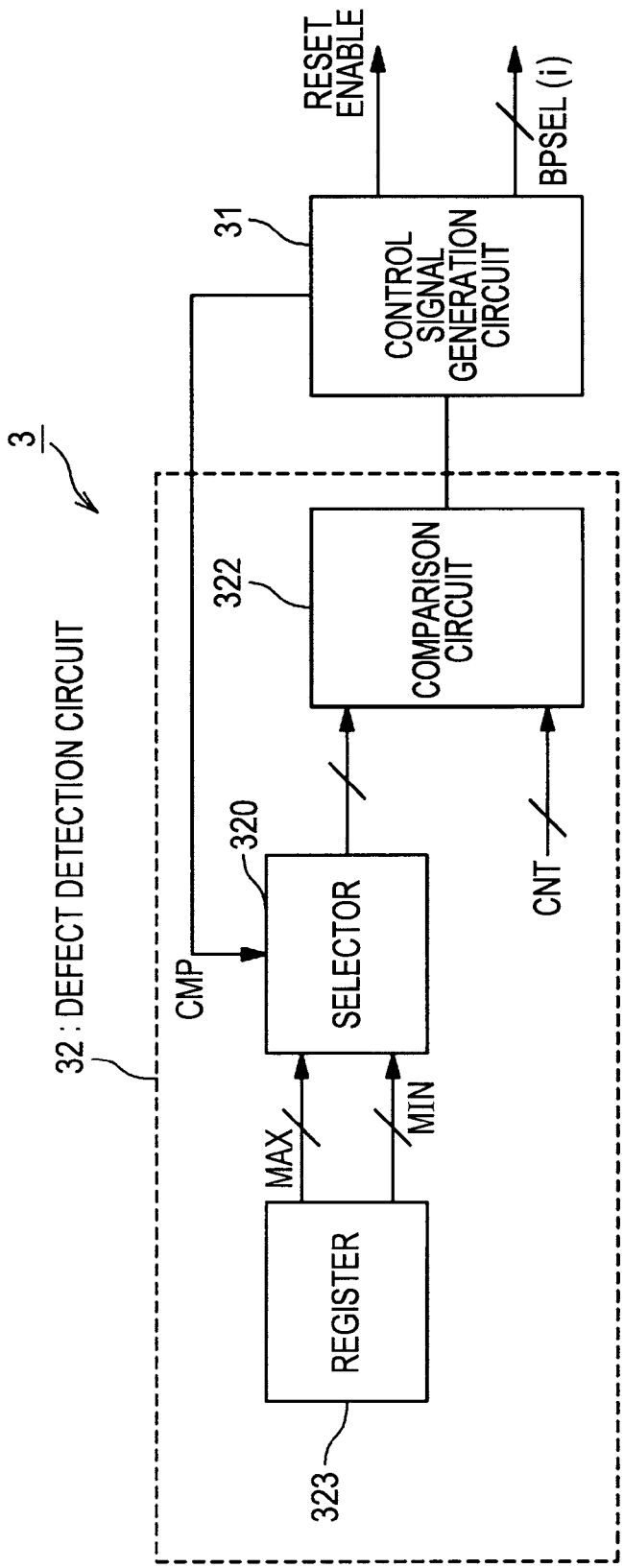
FIG. 17 is a block diagram showing a configuration of the control circuit according to the fourth embodiment of the present invention.

FIG. 17 is a block diagram showing a configuration of the control circuit 3 according to the fourth embodiment of the present invention. The control circuit 3 of FIG. 17 is equivalent to the control circuit 3 according to the first embodiment of the present invention to which the following modification is added. That is, the control signal generation circuit 31 does not include the SEL signal output portion or the G(i) signal output portion, but includes a BPSEL(i) signal output portion instead. The defect detection circuit 32 does not include the selector 321. The comparison circuit 322 does not include the second input portion, but includes a CNT signal input portion instead.

The control signal generation circuit 31 switches the BPSEL(i) signal to thereby successively switch the delay element 20(i) to be bypassed. The comparison circuit 322 receives the CNT signal, compares the MAX signal or the MIN signal inputted thereto from the selector 320 with the CNT signal, and outputs the result thereof toward the control signal generation circuit 31. The other components, coupling relations, and operations of the control circuit 3 of FIG. 17 are the same as in the case of the first embodiment of the present invention, and therefore a further description is omitted.

Figure 18:
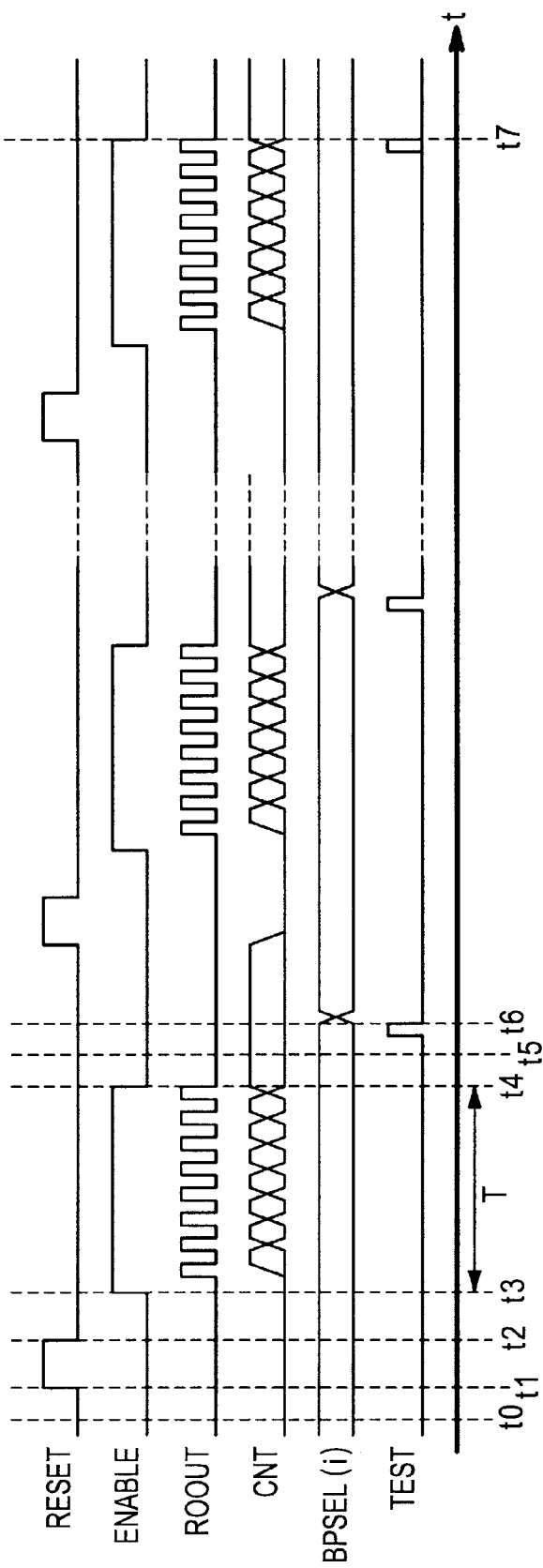
FIG. 18 is a time chart for illustrating an operation of the semiconductor integrated circuit device according to the fourth embodiment of the present invention.

FIG. 18 is a time chart for illustrating an operation of the semiconductor integrated circuit device 1 according to the fourth embodiment of the present invention. The time chart of FIG. 18 shows the respective graphs of the RESET signal, the ENABLE signal, the ROOUT signal, the CNT signal, the BPSEL(i) signal, and the CMP signal in a descending order. In each of the graphs of FIG. 18, the abscissa axis represents elapsed time, and the ordinate axis represents the intensity of each of the signals.

The time t0 shows an initial state, in which RESET=0 and ENABLE=0 are satisfied. At the time t1, the RESET signal shifts to the HIGH state to reset the count of the counter 203. At the time t2, the RESET signal returns to the LOW state.

During the time period T from the time t3 to the time t4, the ENABLE signal shifts to the HIGH state, and the ring oscillator 202 oscillates only during the time period. When the oscillation period of the ring oscillator 202 is assumed to be TROSC, the count of the counter 203 at the time t4 becomes a quotient obtained by dividing T by TROSC. However, in the same manner as in the case of the first embodiment of the present invention, the remainder of the division is ignored, and the quotient will be hereinafter represented by T/TROSC.

The count of the counter 203 is sent as the CNT signal to the comparison circuit 322. The selector 320 transmits either of the MAX signal and the MIN signal supplied from the register 323 to the comparison circuit 322. When the CMP signal outputted from the control signal generation circuit 31 is in the LOW state, the MIN signal is transmitted to the comparison circuit 322. When the CMP signal outputted from the control signal generation circuit 31 is in the HIGH state, the MAX signal is transmitted to the comparison circuit 322. The comparison circuit 322 compares the value of the MAX signal or the MIN signal with the value of the CNT signal, and outputs the result thereof toward the control signal generation circuit 31.

Here, when MIN>CNT or CNT>MAX is obtained as the comparison result, it follows that the delay elements 20(i) that have operated as the ring oscillator 202 include a defective item. In this case, the control signal generation circuit 31 switches the value of the PSEL(i) signal to thereby switch the delay element 20 to be bypassed in the ring oscillator 202.

Thereafter, until the comparison result satisfies MIN<CNT<MAX, the operation from the time t1 to the time t6 is repeated, while the delay element 20(i) to be bypassed is switched.

The time t7 shows a time point when the BPSEL(i) signal no more switches, i.e., when the comparison result satisfies MIN<CNT<MAX. The value of the CNT signal at this time serves as a monitor output.

Thus, by using the semiconductor integrated circuit device 1 according to the fourth embodiment of the present invention, it is possible to bypass any of the multiple delay elements 20(i) included in the ring oscillator 202 of the monitor circuit 2 that shows an abnormal delay time. As a result, the performance of a chip can be monitored with high accuracy.

Figure 19:
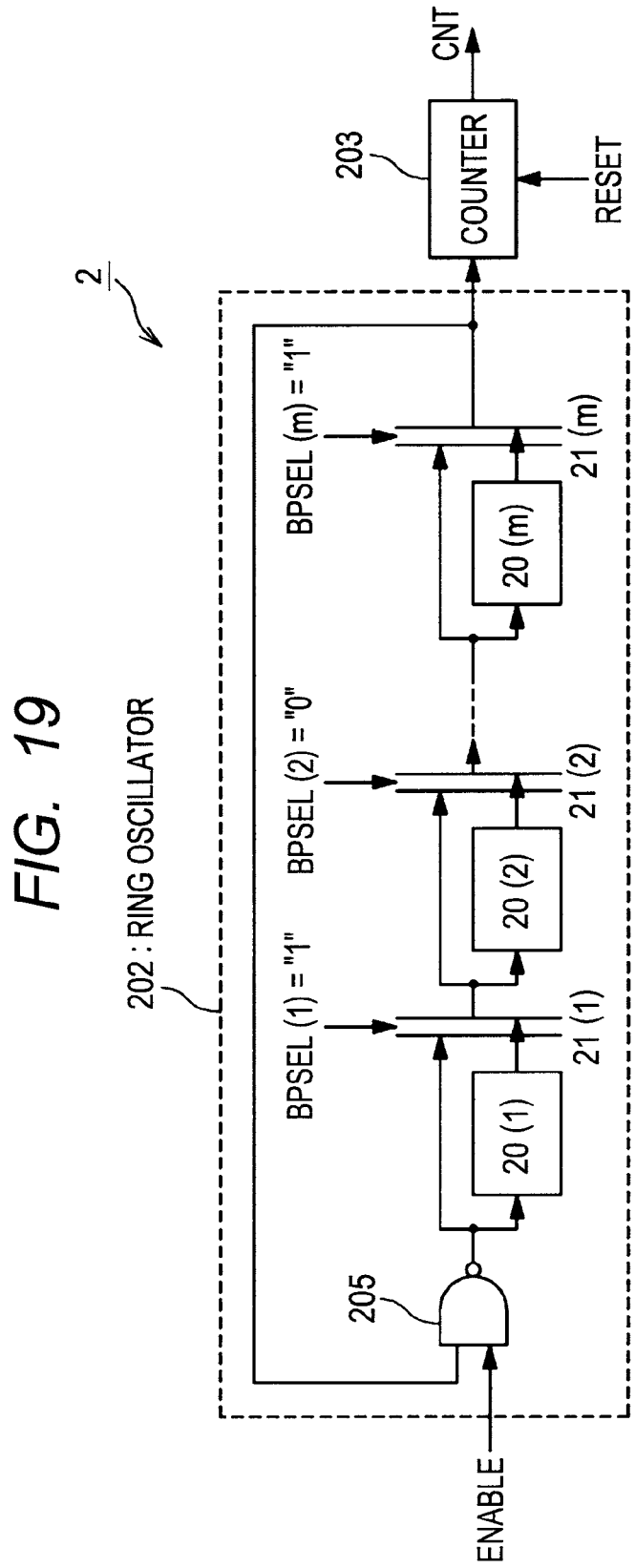
FIG. 19 is a block diagram showing another configuration of the monitor circuit according to the fourth embodiment of the present invention.

FIG. 19 is a block diagram showing another configuration of the monitor circuit 2 according to the fourth embodiment of the present invention. The monitor circuit 2 of FIG. 19 is equivalent to the monitor circuit 2 of FIG. 17 according to the fourth embodiment of the present invention to which the following modification is added. That is, the front selectors 22(i) are removed, and the output portion of the NAND gate 205 and the output portion of each of the rear selectors 21(i) except for that in the rearmost stage are constantly coupled to the input portions of the selector (i+1) and the delay element (i+1) each in the frontmost stage or in the next frontmost stage. The other components, coupling relations, and operations are the same as in the case of FIG. 17, and therefore a further description is omitted.

In the case of FIG. 19, the bypassed delay element 20(i) also operates so that power consumption increases accordingly. However, a chip area can be reduced by an area corresponding to the omitted front selectors 22(i). Further, as the total number m of the delay elements 20(i) is larger, the proportion of the overhead of power consumption can be reduced.

Note that, in the description given above, the number of the delay element 20(i) that can be bypassed at a time is assumed to be one. However, it is also possible to provide a configuration in which the control signal generation circuit 31 outputs BPSEL(i) as necessary to thereby allow multiple the delay elements 20(i) to be bypassed.

Fifth Embodiment

Figure 20:
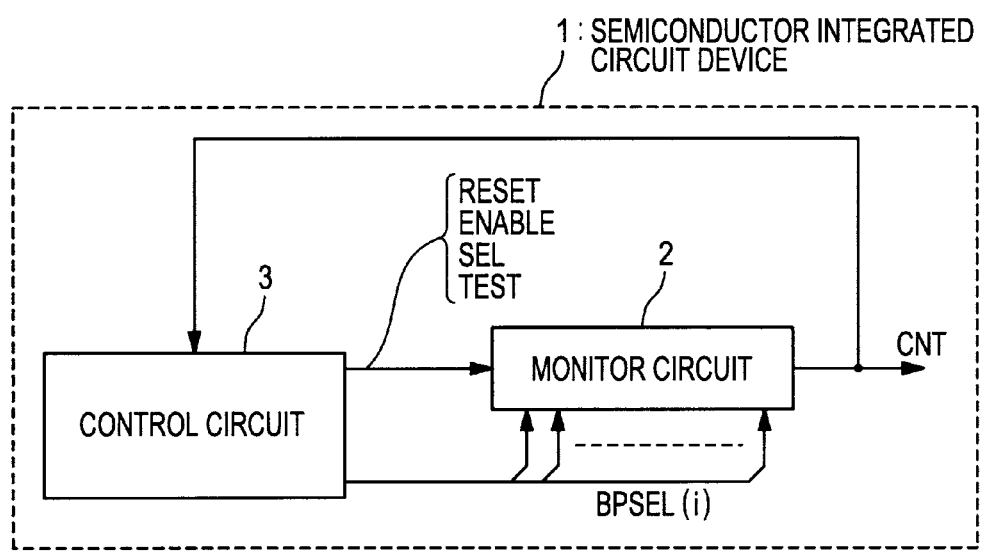
FIG. 20 is a block diagram showing a configuration of the semiconductor integrated circuit device according to a fifth embodiment of the present invention.

FIG. 20 is a block diagram showing a configuration of the semiconductor integrated circuit device 1 according to a fifth embodiment of the present invention. The semiconductor integrated circuit device 1 of FIG. 20 is equivalent to the semiconductor integrated circuit device 1 according to the fourth embodiment of the present invention to which the following modification is added. That is, the control circuit further includes a TEST signal output portion and a SEL signal output portion. The monitor circuit 2 further includes a TEST signal input portion and a SEL signal input portion. The TEST signal output portion and the SEL signal output portion of the control circuit 3 are respectively coupled to the TEST signal input portion and the SEL signal input portion of the monitor circuit 2. The other components, coupling relations, and operations are the same as in the case of the fourth embodiment of the present invention, and therefore a further description is omitted.

Note that, in the semiconductor integrated circuit device 1 according to the fifth embodiment of the present invention also, in the same manner as in the case of the fourth embodiment of the present invention, the same summing circuit 4 as in the third embodiment of the present invention, which is not shown, is preferably coupled in the state subsequent to the CNT signal output portion of the monitor circuit 2.

Figure 21:
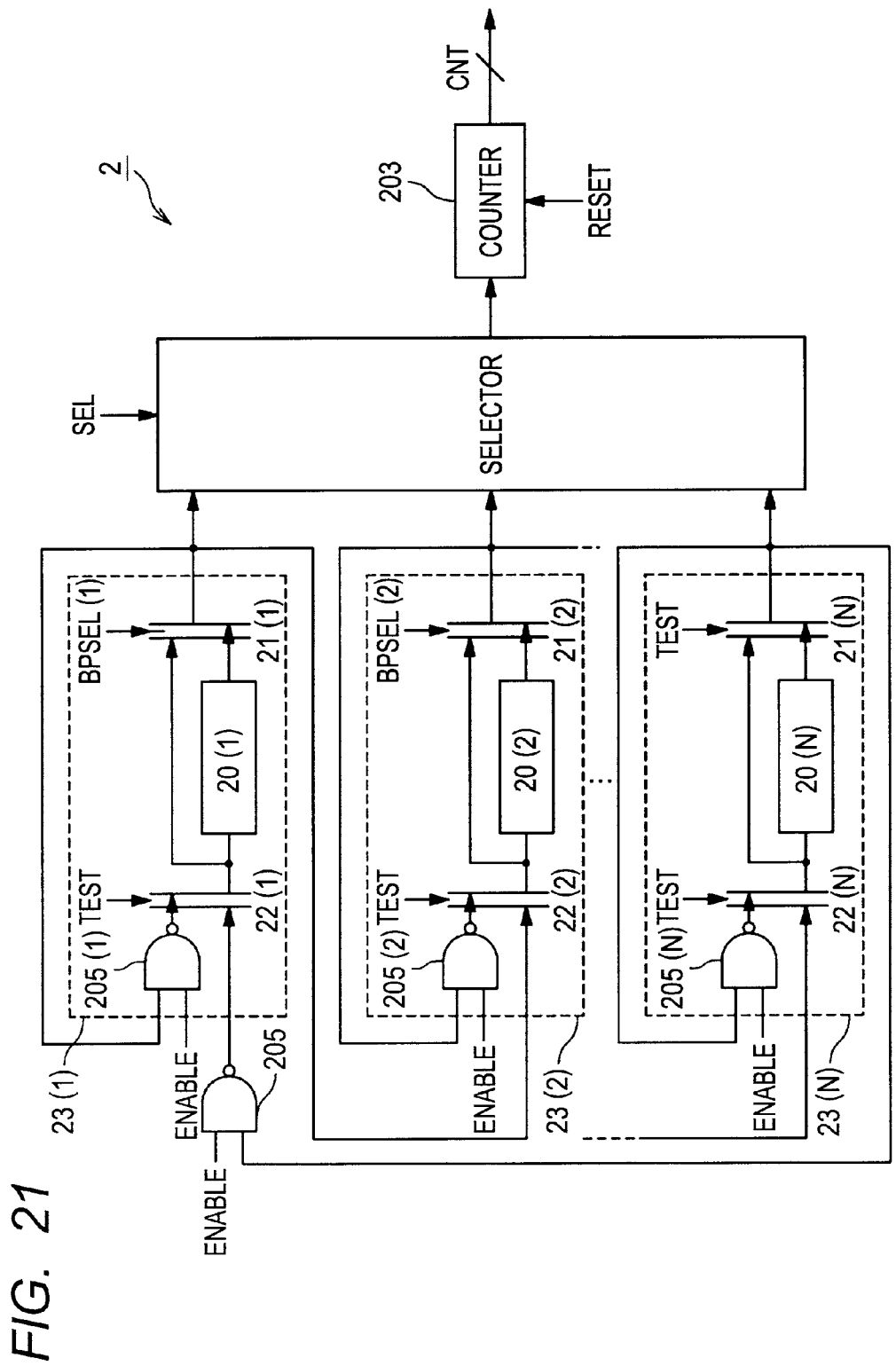
FIG. 21 is a block diagram showing a configuration of the monitor circuit according to the fifth embodiment of the present invention.

FIG. 21 is a block diagram showing a configuration of the monitor circuit 2 according to the fifth embodiment. A description will be given of the components of the monitor circuit 2 of FIG. 21. The monitor circuit 2 of FIG. 21 includes the NAND gate 205, N ring oscillators 23(i), the selector 201, and the counter 203. Note that, here, "i" also indicates an integer included in the range of 1 to N.

The N ring oscillators 23(i) include respective NAND gates 205(i), the respective front selectors 22(i), and the respective rear selectors 21(i).

Each of the NAND gate 205 and the NAND gates 205(i) has a first input portion, an ENABLE signal input portion, and an output portion. Each of the front selectors 22(i) includes first and second input portions, a TEST signal input portion, and an output portion. Each of the delay elements 20(i) includes an input portion and an output portion. Each of the rear selectors 21(i) includes first and second input portions, a BPSEL(i) signal input portion, and an output portion. The selector 201 includes N i-th input portions, a SEL signal input portion, and an output portion. The counter 203 includes a first input portion, a RESET signal input portion, and a CNT signal output portion.

A description will be given of coupling relations in the monitor circuit 2 of FIG. 21. The ENABLE signal input portions of the NAND gate 205 and the NAND gates 205(i) are each coupled to the ENABLE signal input portion of the monitor circuit 2. The SEL signal input portion of the selector 201 is coupled to the ENABLE signal input portion of the monitor circuit 2. The RESET signal input portion and the CNT signal output portion of the counter 203 are respectively coupled to the RESET signal input portion and the CNT signal output portion of the monitor circuit 2. The respective ENABLE signal input portions of the N NAND gates 205(i) are each coupled to the ENABLE signal input portion of the monitor circuit 2. The respective TEST signal input portions of the N front selectors 22(i) are each coupled to the TEST signal input portion of the monitor circuit 2. The respective BPSEL(i) signal input portions of the N rear selectors 21(i) are each coupled to the BPSEL(i) signal input portion of the monitor circuit 2.

The output portion of the NAND gate 205 is coupled to the first input portion of the first front selector 22(1). The output portion of the first NAND gate 205(1) is coupled to the second input portion of the first front selector 22(1). The output portion of the first front selector 22(1) is coupled to the input portion of the first delay element 20(1) and to the first input portion of the first rear selector 21(1). The output portion of the first delay element 20(1) is coupled to the second input portion of the first rear selector 21(1). The output portion of the second rear selector 21(2) is coupled to the first input portion of the first NAND gate 205(1), to the first input portion of the selector 201, and to the first input portion of the second front selector 22(2).

In the same manner as described above, a generalized description will be given below using i included in the range of 2 to N−1. The output portion of the i-th NAND gate 205(i) is coupled to the second input portion of the i-th front selector 22(i). The output portion of the i-th front selector 22(i) is coupled to the input portion of the i-th delay element 20(i) and to the first input portion of the i-th rear selector 21(i). The output portion of the i-th delay element 20(i) is coupled to the second input portion of the i-th rear selector 21(i). The output portion of the i-th rear selector 21(i) is coupled to the first input portion of the i-th NAND gate 205(i), to the first input portion of the selector 201, and to the first input portion of the (i+1)-th front selector 22(i+1).

Finally, the output portion of the N-th NAND gate 205(N) is coupled to the second input portion of the N-th front selector 22(N). The output portion of the N-th front selector 22(N) is coupled to the input portion of the N-th delay element 20(N) and to the first input portion of the N-th rear selector 21(N). The output portion of the N-th delay element 20(N) is coupled to the second input portion of the N-th rear selector 21(N). The output portion of the N-th rear selector 21(N) is coupled to the first input portion of the N-th NAND gate 205(N), to the first input portion of the selector 201, and to the first input portion of the first front selector 22(1). The output portion of the selector 201 is coupled to the first input portion of the counter 203.

A description will be given of an operation of the monitor circuit 2 of FIG. 21. The monitor circuit 2 of FIG. 21 has two states switched in accordance with a TEST signal, i.e., a test state and a monitor state. In the semiconductor integrated circuit device 1 according to the fifth embodiment of the present invention, the test state and the monitor state are defined as follows.

First, when the TEST signal is in the HIGH state, the second input portion and the output portion of each of the front selectors 22(i) become conductive, and the output portion of the corresponding delay element 20(i) is coupled to the input portion via the corresponding NAND gate 205(i) so that the N ring oscillators 23(i) independently operate. This state of the monitor circuit 2 of FIG. 21 is called the test state.

Next, when the TEST signal is in the LOW state, the first input portion and the output portion of each of the front selectors 22(i) become conductive so that the N delay elements 20(i) are coupled in series in a numerical order. The N delay elements 20(i) are further coupled into ring shape via the NAND gate 205 to operate as a single ring oscillator. This state of the monitor circuit 2 of FIG. 21 is called a monitor state.

In the monitor state, each of the N delay elements 20(i) is independently bypassed in accordance with the corresponding BPSEL(i) signal. That is, when the BPSEL(i) signal is in the LOW state, the first input portion and the output portion of the corresponding rear selector 21(i) are coupled, i.e., the output portion of the corresponding front selector 22(i) is coupled to the output portion of the corresponding rear selector 21(i). Conversely, when the BPSEL(i) is in the HIGH state, the second input portion and the output portion of the corresponding rear selector 21(i) are coupled, i.e., the output portion of the corresponding delay element 20(i) is coupled to the corresponding rear selector 21(i).

Figure 22:
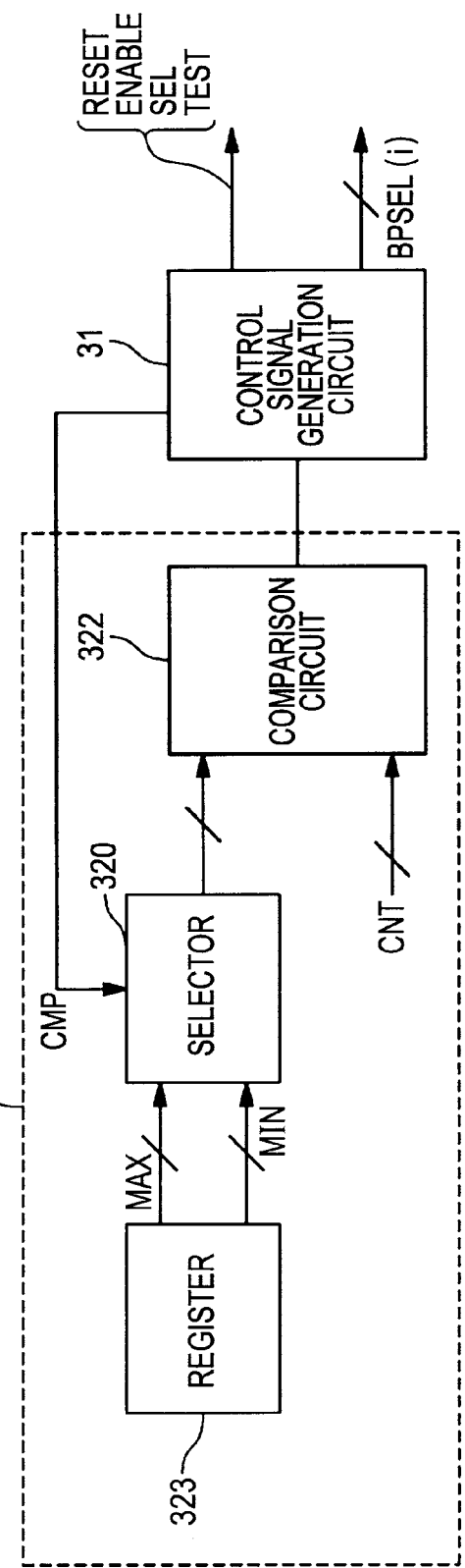
FIG. 22 is a block diagram showing a configuration of the control circuit according to the fifth embodiment of the present invention.

FIG. 22 is a block diagram showing a configuration of the control circuit 3 according to the fifth embodiment of the present invention. The control circuit 3 of FIG. 22 is equivalent to the control circuit 3 according to the fourth embodiment of the present invention to which the following modification is added. That is, the control signal generation circuit 31 further includes a SEL signal output portion and a TEST signal output portion, and further generates a SEL signal and the TEST signal. The other components, coupling relations, and operations in the control circuit 3 of FIG. 22 are the same as in the case of the fourth embodiment of the present invention, and therefore a further description is omitted.

Figure 23:
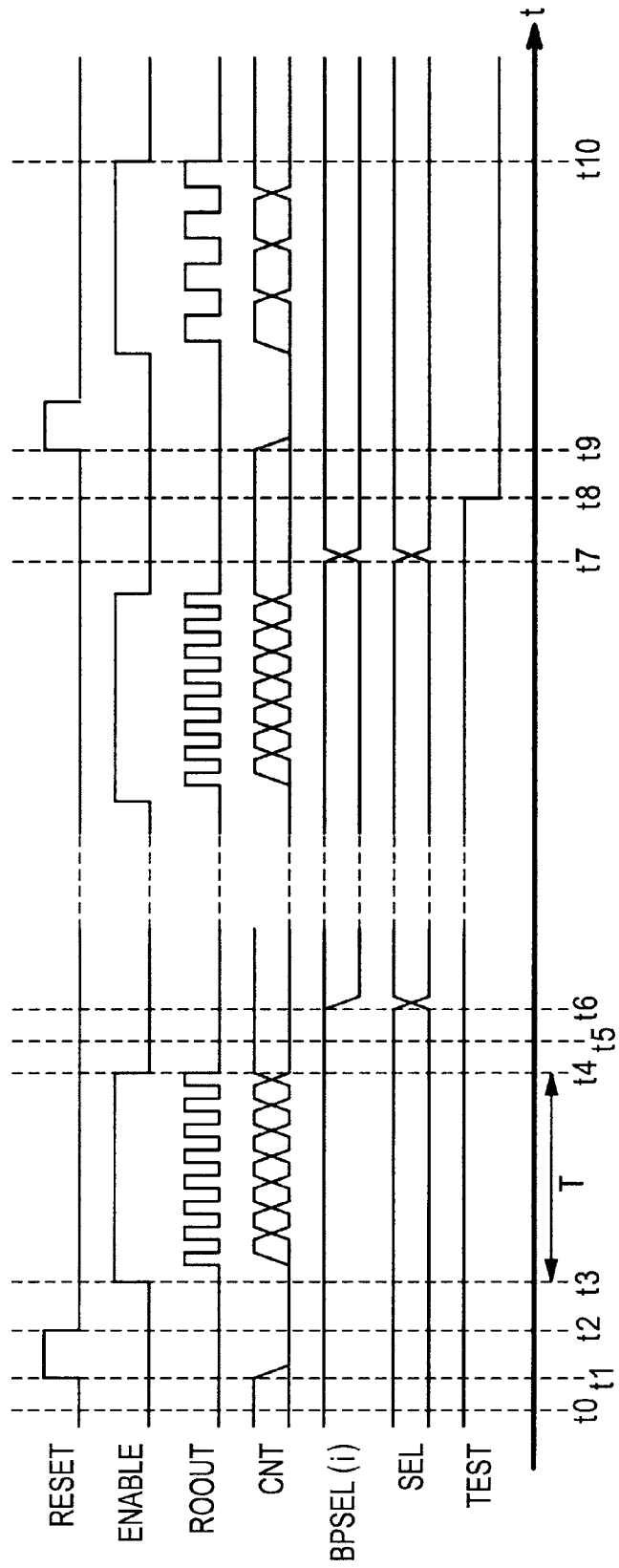
FIG. 23 is a flow chart for illustrating an operation of the semiconductor integrated circuit device according to the fifth embodiment of the present invention.

FIG. 23 is a flow chart for illustrating an operation of the semiconductor integrated circuit device 1 according to the fifth embodiment of the present invention. The flow chart of FIG. 23 has graphs representing respective time variations in the RESET signal, the ENABLE signal, the ROOUT signal, the CNT signal, the BPSEL(i) signal, the SEL signal, and the TEST signal in a descending order. In each of the graphs, the abscissa axis represents elapsed time, and the ordinate axis represents the intensity of each of the signals.

The time t0 shows an initial state, in which RESET=0, ENABLE=0, and TEST=1 are satisfied. Hereinafter, until the TEST signal shifts to the LOW state at the time t8, the semiconductor integrated circuit device 1 according to the fifth embodiment of the present invention operates in the test state. Each of the i's included in the range of 1 to N satisfies BPSEL(i)=1.

At the time t1, the RESET signal shifts to the HIGH state to reset the count of the counter 203. At the time t2, the RESET signal returns to the LOW state.

At the time t3, the value of the SEL signal becomes 1. This specifies the first ring oscillator 23(1) from among the N ring oscillators 23(i). During the time period T from the time t3 to the time t4, the ENABLE signal is in the HIGH state and, only during the time period, the ring oscillator 23(1) oscillates. Here, it may also be possible that the other ring oscillators 23(i) simultaneously oscillate.

An output signal from the ring oscillator 23(1) is supplied to the counter 203 via the selector 201. The counter 203 counts the number of oscillations in the output signal from the ring oscillator 23(1), and outputs the counted number as the CNT signal. Here, when the oscillation period of the ring oscillator 23(1) is assumed to be TROSC1, the value of the CNT signal at the time t5 becomes a quotient obtained by dividing T by TROSC1. However, in the same manner as in the case of the first embodiment of the present invention, the remainder of the division is ignored, and the quotient will be hereinafter represented by T/TROSC1.

The CNT signal is sent to the defect detection circuit 32, and compared with each of the MAX signal and the MIN signal in the same manner as in the other embodiments of the present invention. When the value of the CNT signal is determined to be defective, at the time t6, the BPSEL(1) signal shifts to the LOW state.

Also at the time t6, the value of the SEL signal becomes 2 to specify the second ring oscillator 23(2). Subsequently, in the same manner as described above, the SEL signal successively switches and, for each of the N ring oscillators 23(i), the operation from the time t1 to the time t6 is repeated.

When the determination for each of the ring oscillators 23(i) is completed, at the time t7, the value of the SEL signal is set to N. Thereafter, at the time t8, the TEST signal shifts to the LOW state, and the semiconductor integrated circuit device 1 according to the fifth embodiment of the present invention shifts to the monitor state. During the period from the time t9 to the time t10, for one ring oscillator with which BPSEL(i) is in the HIGH state, i.e., in which all the delay elements 20(i) determined to be effective are coupled in series, the operation from the time t1 to the time t5 is performed.

At the time t10 and thereafter, the CNT signal outputted from the counter 203 and the M signal representing the number of the BPSEL(i) signals in the HIGH state, i.e., the total number of the effective delay elements 20(i) are supplied to the summing circuit 4 not shown. The summing circuit 4 calculates and outputs CNT/M.

Thus, by using the semiconductor integrated circuit device 1 according to the fifth embodiment of the present invention, any of the delay elements 20(i) showing an abnormal delay time is excluded from the ring oscillators included in the monitor circuit 2. This allows the performance of a chip to be monitored with high accuracy. In addition, in the fifth embodiment of the present invention, each of the delay elements 20(i) is individually determined in advance to be normal or defective. Therefore, even when there are the multiple delay elements 20(i) each showing an abnormal characteristic, it is possible to easily detect and exclude a defective portion.

Figure 24:
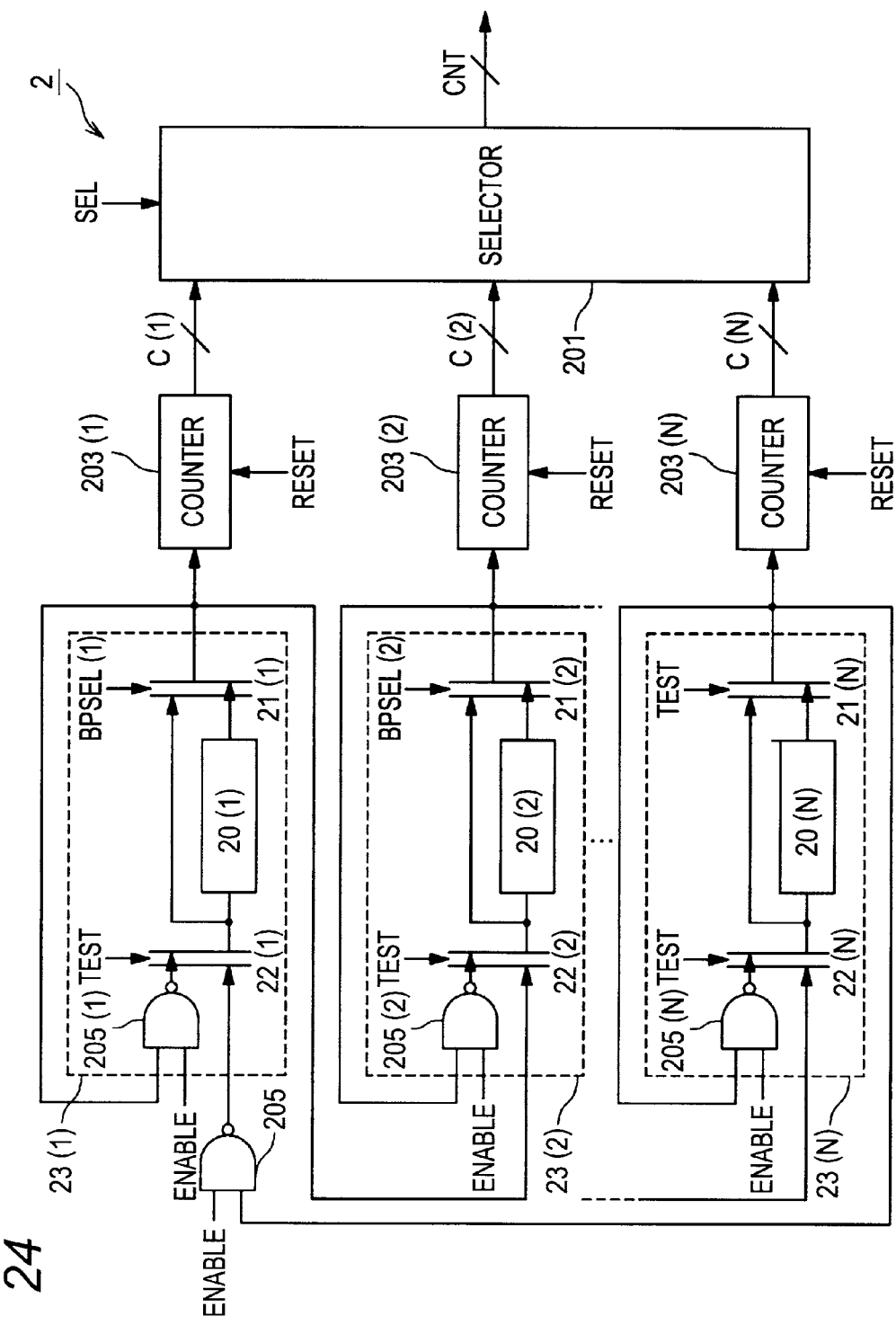
FIG. 24 is a block diagram showing another configuration of the monitor circuit according to the fifth embodiment of the present invention.

FIG. 24 is a block diagram showing another configuration of the monitor circuit 2 according to the fifth embodiment of the present invention. The monitor circuit 2 of FIG. 24 is equivalent to the monitor circuit 2 of FIG. 21 to which the following modification is added. That is, the counter 203 disposed in the stage subsequent to the selector 201 is removed and, instead, N counters 230(i) are disposed between the respective output portions of the ring oscillators 23(i) and the input portion of the selector 201.

Figure 25:
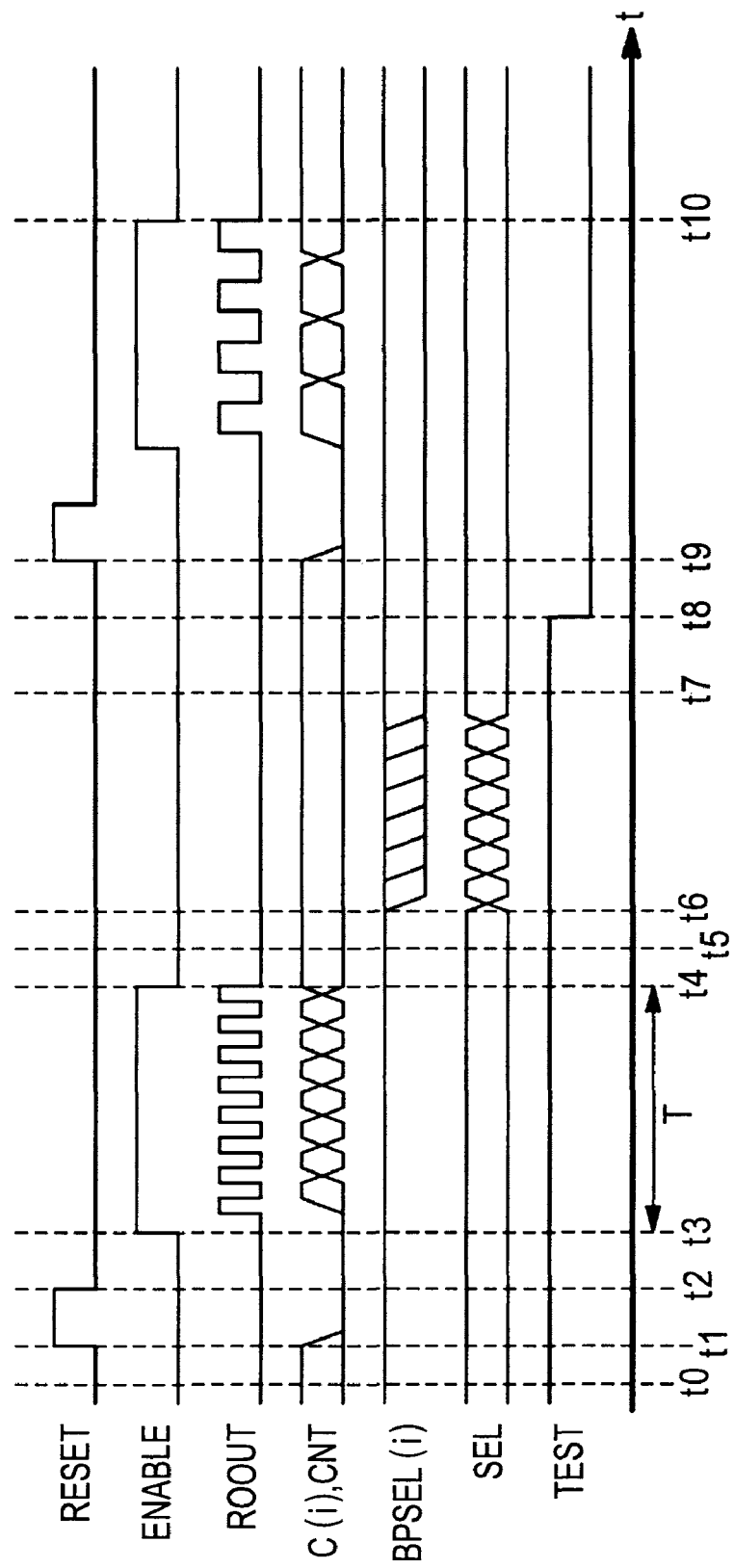
FIG. 25 is a time chart for illustrating an operation of the semiconductor integrated circuit device according to the fifth embodiment of the present invention when the monitor circuit of FIG. 24 is used.

The arrangement allows delay times in the N delay elements 20(i) to be simultaneously measured. FIG. 25 is a time chart for illustrating an operation of the semiconductor integrated circuit device 1 according to the fifth embodiment of the present invention in the case of using the monitor circuit 2 of FIG. 24. The time chart of FIG. 25 is equivalent to the time chart of FIG. 23 to which the following modification is added. That is, in the case of the time chart of FIG. 25, from the time t3 to the time t4, ENABLE=1 is satisfied. Then, from the time t6 to the time t7, mere switching of the SEL signal allows the individual delay elements 20(i) to be successively subjected to defect determination to allow a reduction in evaluation time.

The other components, coupling relations, and operations of the monitor circuit 2 of FIG. 24 and in the time chart of FIG. 25 are the same as in the cases of FIGS. 21 and 23, and therefore a further description is omitted.

Sixth Embodiment

Figure 26:
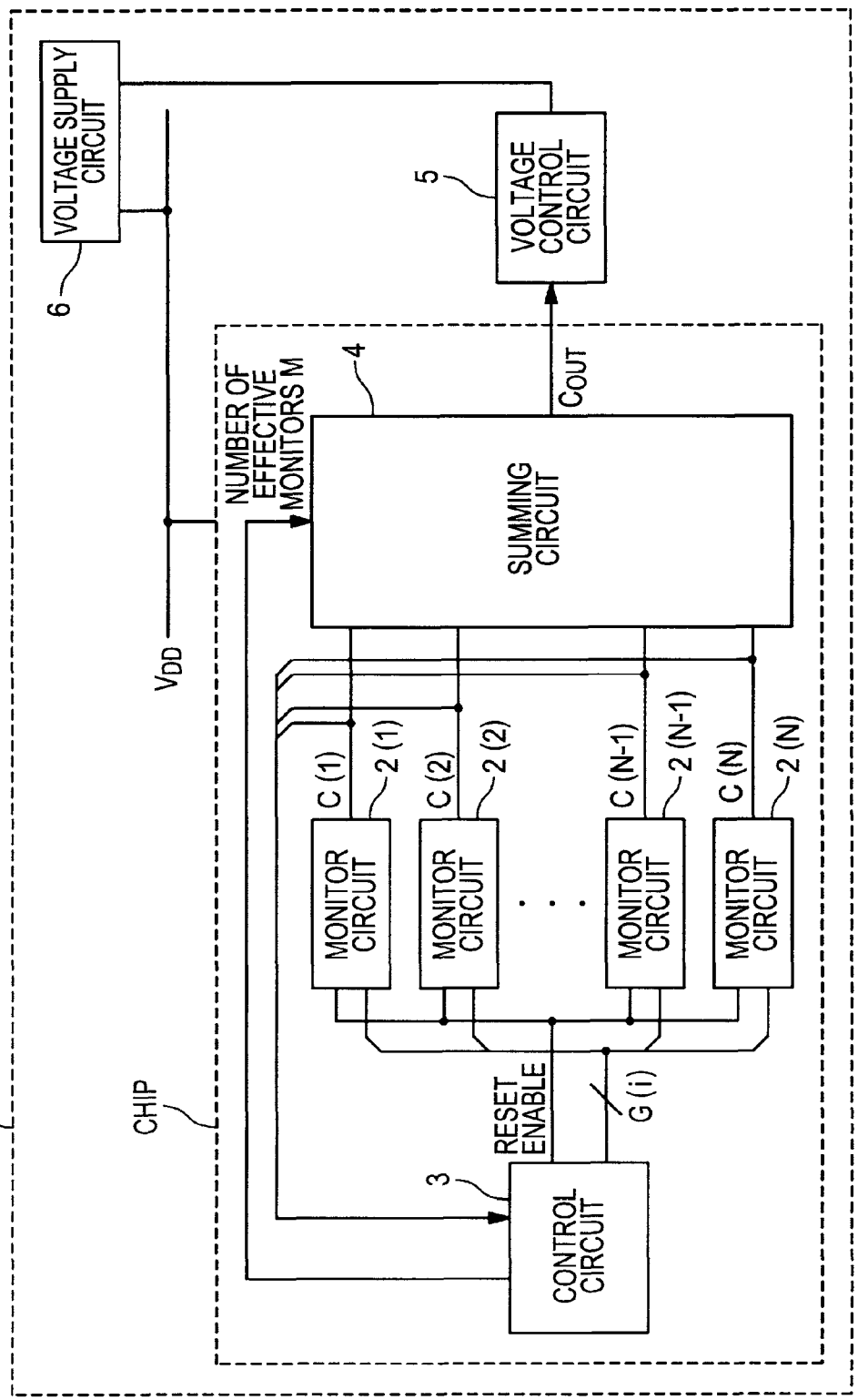
FIG. 26 is a block diagram showing a configuration of the semiconductor integrated circuit device according to a sixth embodiment of the present invention.

FIG. 26 is a block diagram showing a configuration of the semiconductor integrated circuit device 1 according to a sixth embodiment of the present invention. The semiconductor integrated circuit device 1 of FIG. 26 is equivalent to the semiconductor integrated circuit device 1 according to the first embodiment of the present invention to which the following modification is added. That is, the semiconductor integrated circuit device 1 according to the sixth embodiment of the present invention includes a chip, a voltage control circuit 5, and a voltage supply circuit 6. Here, the chip includes the components of the semiconductor integrated circuit device 1 according to the first embodiment of the present invention.

The chip includes a voltage input portion and a $C_{out}$ signal output portion. The voltage control circuit 5 includes a $C_{out}$ signal input portion and a control signal output portion. The voltage supply circuit 6 includes a control signal input portion and a voltage output portion.

The $C_{out}$ signal output portion of the summing circuit 4 is coupled to the $C_{out}$ signal output portion of the chip. The $C_{out}$ signal output portion of the chip is coupled to the $C_{out}$ signal input portion of the voltage control circuit 5. The control signal output portion of the voltage control circuit 5 is coupled to the control signal input portion of the voltage supply circuit 6. The voltage output portion of the voltage supply circuit 6 is coupled to the voltage input portion of the chip. The voltage input portion of the chip is coupled to the voltage input portion of each of the components in the chip, which is not shown.

The other components and coupling relations of the semiconductor integrated circuit device 1 according to the sixth embodiment of the present invention are the same as in the case of the first embodiment of the present invention, and therefore a further description is omitted.

Figure 27:
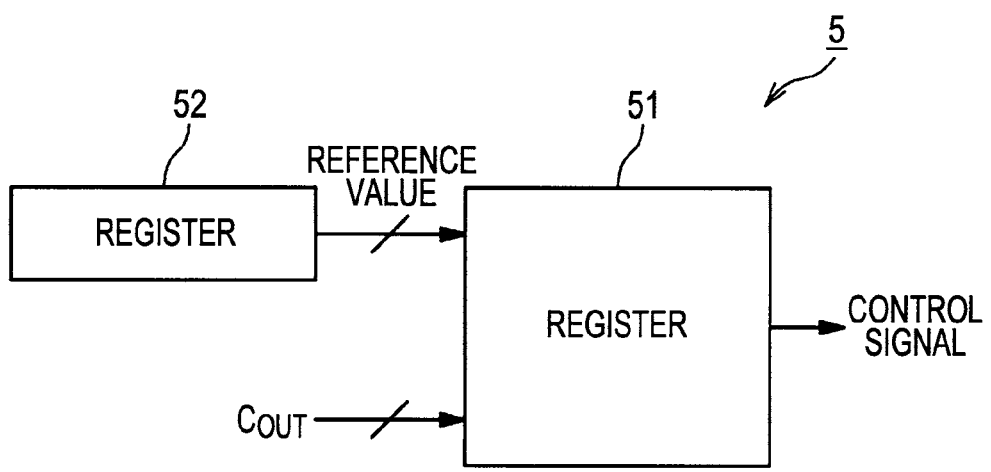
FIG. 27 is a block diagram showing a configuration of a voltage control circuit according to the sixth embodiment of the present invention.

FIG. 27 is a block diagram showing a configuration of the voltage control circuit 5 according to the sixth embodiment of the present invention. A description will be given of the components of the voltage control circuit 5 of FIG. 27. The voltage control circuit 5 of FIG. 27 includes a register 52 and a comparison circuit 51.

The register 52 includes a reference value signal output portion. The comparison circuit 51 includes a reference value signal input portion, a $C_{out}$ signal input portion, and a control signal output portion.

A description will be given of coupling relations in the voltage control circuit 5 of FIG. 27. The reference value signal output portion of the register 52 is coupled to the reference value signal input portion of the comparison circuit 51. The $C_{out}$ signal input portion of the comparison circuit 51 is coupled to the $C_{out}$ signal input portion of the voltage control circuit 5. The control signal output portion of the comparison circuit 51 is coupled to the control signal output portion of the voltage control circuit 5.

A description will be given of an operation of the voltage control circuit 5 of FIG. 27. The register 52 stores therein a reference value for a monitor output. As an example of the reference value, there is used a value to be outputted as the CNT signal from the summing circuit 4 when a process for the chip in which the monitor circuits 2(i) are mounted, a voltage supplied to the chip, the temperature of the chip, and the like satisfy specified conditions.

The comparison circuit 51 receives a reference value signal showing the reference value and the CNT signal, compares the magnitudes of the two signals, and outputs the result thereof as a control signal. Here, when the value of the CNT signal is larger than the reference value, the comparison circuit 51 according to the sixth embodiment of the present invention generates a control signal for reducing a power source voltage $V_{DD}$, and outputs the control signal toward the power supply circuit 6. Conversely, when the value of the CNT signal is smaller than the reference value, the comparison circuit 51 according to the sixth embodiment of the present invention generates a control signal for increasing the power source voltage $V_{DD}$, and outputs the control signal toward the power supply circuit 6. The power supply circuit 6 increases or reduces the power source voltage $V_{DD}$ in accordance with the control signal inputted thereto from the comparison circuit 51.

The CNT signal inputted to the comparison circuit 51 is obtained as a result of a process in which the monitor circuits 2(i), the control circuit 3 and the summing circuit 4 are supplied with the power source voltage $V_{DD}$, and complete a sequence of monitor operations. By repeating the monitor operations and the control operation for the voltage supply circuit 6, an output value of the summing circuit 4 finally converges to the reference value.

Thus, by using the semiconductor integrated circuit device of the present embodiment, a value obtained by averaging performance variations in the chip can be detected using the monitor circuits disposed at multiple locations in the chip. Moreover, since the monitor circuits remaining after the exclusion of the monitor circuits each showing an abnormal value perform the monitor operations, the performance of the chip can be monitored with high accuracy.

Using the monitor circuits disposed at the multiple locations in the chip, the value obtained by averaging performance variations in the chip can be detected. Additionally, since the oscillation periods of the ring oscillators in the individual monitor circuits can be accurately equalized, the performance of the chip can be monitored with high accuracy. Furthermore, by performing voltage control in accordance with the monitor result, the performance of the chip can accurately be brought closer to a target value.

Note that, in the present embodiment, only one reference value is used and compared with the output value of the summing circuit, but it may also be possible to store the maximum reference value MAX and the minimum reference value MIN in the register 52, control the voltage supply circuit 6 so as to reduce the power source voltage $V_{DD}$ when the monitor output value is larger than MAX or increase the power source voltage $V_{DD}$ when the monitor output value is smaller than MIN, and perform a control operation such that the output value of the summing circuit is finally between MAX and MIN. By such a control operation, the control operation for the power source voltage stops at the time when the performance of the chip falls within a predetermined range. Therefore, it is possible to constantly prevent fluctuations in power source voltage.

In the present embodiment, the power source voltage $V_{DD}$ to the circuit is controlled in accordance with the output value of the summing circuit. However, instead of the power supply voltage, a substrate bias may also be controlled. In this case, the voltage control circuit 6 supplies the substrate bias to the circuit, and controls the substrate bias so as to deepen the substrate bias when the output value of the summing circuit is larger than the reference value or shallow the substrate bias when the output value of the summing circuit is smaller than the reference value. By performing such control, the power source voltage is constantly held constant so that, even when signal transmission/reception is performed with another chip, it is basically unnecessary to use a level shifter.

Also in the present embodiment, as the reference value, the value to be outputted from the summing circuit when the process for the chip in which the monitor circuits are mounted, the voltage, and the temperature are under specified conditions is used. However, the reference value may also be an arbitrary value determined based on design or the result of testing a real chip.

The description has been given heretofore of the multiple embodiments of the present invention. It will be appreciated that the configurations and operations of the semiconductor integrated circuit devices 1 according to the multiple embodiments can be freely combined within a technically consistent scope. For example, the configuration of the semiconductor integrated circuit device 1 according to the third embodiment of the present invention in which the reference value for defect determination is dynamically calculated in accordance with the output signal from the summing circuit can be easily combined with the configuration of any of the other embodiments.

What is claimed is:

1. A semiconductor integrated circuit device, comprising:
a plurality of delay elements individually disposed at a plurality of locations in a semiconductor chip, and having respective characteristics in accordance with the locations;
a group of monitor circuits for measuring the characteristics of the delay elements;
a control circuit for controlling the group of monitor circuits; and
a summing circuit for summing results of the measurement to calculate an overall characteristic of the semiconductor chip,
wherein the control circuit excludes, from a target of the summation, any of the delay elements which shows the result of the measurement falling outside a predetermined range indicating that a respective monitor circuit of the group of monitor circuits is not operating normally.

2. A semiconductor integrated circuit device according to claim
wherein the group of monitor circuits include:
a group of ring oscillators including the delay elements, and each controlled by the control circuit to oscillate only for a predetermined time,
wherein the group of ring oscillators include oscillation periods dependent on the respective locations where the delay elements included therein are disposed, and
wherein the group of monitor circuits further include:
respective counters each for measuring a number of times that the corresponding ring oscillator oscillates within the predetermined time.

3. A semiconductor integrated circuit device according to claim 2,
wherein the group of ring oscillators further include respective NAND gates having input portions and output portions which are coupled in ring shape to the delay elements, and
wherein each of the NAND gates includes a control signal input portion to which a signal for specifying the predetermined time is inputted from the control circuit.

4. A semiconductor integrated circuit device according to claim 2, further comprising:
AND circuits controlled by the control circuit to disable output signals from the group of ring oscillators,
wherein each of the counters is coupled to a stage previous to the corresponding AND circuit.

5. A semiconductor integrated circuit device according to claim 2, further comprising:
AND circuits controlled by the control circuit to disable output signals from the group of ring oscillators,
wherein each of the counters is coupled to a stage subsequent to the corresponding AND circuit.

6. A semiconductor integrated circuit device according to claim 3, wherein the delay elements are coupled in series between the output portions and the input portions of the NAND gates, and wherein the group of ring oscillators have a group of first selectors controlled by the control circuit to individually bypass the delay elements.

7. A semiconductor integrated circuit device according to claim 6, wherein the group of ring oscillators further include:

a plurality of NAND gates coupled to the respective delay elements; and a group of second selectors controlled by the control circuit to switch couplings between the delay elements and the NAND gates into ring shape.

8. A semiconductor integrated circuit device according to claim 1, further comprising:

a voltage control circuit for generating a voltage control signal in accordance with a result of comparing a result of the summation with a predetermined reference value; and a voltage supply circuit for generating a voltage in accordance with the voltage control signal, and supplying the voltage to each of the monitor circuits, the control circuit, and the summing circuit.

9. A semiconductor integrated circuit device according to claim 1, wherein the control circuit includes an arithmetic circuit for calculating the predetermined range in accordance with the result of the summation.

10. A semiconductor integrated circuit device according to claim 1, wherein the summing circuit calculates any of an average value, a maximum value, and a minimum value of the characteristics in accordance with the locations, and outputs the calculated value as an overall characteristic of the semiconductor chip.

* * * * *